United States Patent
Horie

(10) Patent No.: US 7,626,524 B2
(45) Date of Patent: Dec. 1, 2009

(54) MULTI-CHANNEL SAMPLE AND HOLD CIRCUIT AND MULTI-CHANNEL A/D CONVERTER

(75) Inventor: Masakiyo Horie, Gamagori (JP)

(73) Assignee: Denso Corporation, Kariya (JP)

( * ) Notice: Subject to any disclaimer, the term of this patent is extended or adjusted under 35 U.S.C. 154(b) by 17 days.

(21) Appl. No.: 11/907,840

(22) Filed: Oct. 18, 2007

(65) Prior Publication Data
US 2008/0094272 A1   Apr. 24, 2008

(30) Foreign Application Priority Data
Oct. 19, 2006   (JP) .............................. 2006-285078
Jun. 11, 2007   (JP) .............................. 2007-154055

(51) Int. Cl.
*H03M 1/00* (2006.01)
(52) U.S. Cl. ...................... 341/141; 341/122; 341/155; 341/172; 327/91; 327/94
(58) Field of Classification Search ................. 341/122; 327/91–96
See application file for complete search history.

(56) References Cited

U.S. PATENT DOCUMENTS

| | | | | |
|---|---|---|---|---|
| 5,281,867 A | * | 1/1994 | Campbell et al. ............. 327/91 |
| 5,304,866 A | * | 4/1994 | Uranaka ....................... 327/63 |
| 5,389,833 A | | 2/1995 | Kay | |
| 6,124,739 A | * | 9/2000 | Roither et al. ............... 327/100 |
| 6,300,823 B1 | | 10/2001 | Zhou et al. | |
| 6,320,530 B1 | | 11/2001 | Horie | |
| 6,509,860 B2 | | 1/2003 | Saito | |
| 6,577,263 B2 | | 6/2003 | Saito | |
| 6,636,084 B2 | * | 10/2003 | Sarraj ........................... 327/95 |
| 6,774,831 B2 | | 8/2004 | Saito | |
| 7,113,116 B2 | * | 9/2006 | Brewer et al. ................ 341/122 |
| 2006/0220692 A1 | | 10/2006 | Hirashima | |
| 2007/0080842 A1 | | 4/2007 | Kawahito | |

FOREIGN PATENT DOCUMENTS

JP   A-2007-36580   2/2007

* cited by examiner

*Primary Examiner*—Khai M Nguyen
(74) *Attorney, Agent, or Firm*—Posz Law Group, PLC

(57) ABSTRACT

A multi-channel sample and hold circuit includes an operational amplifier, plural electric charge setting channels. Each of the electric charge setting channels includes an input terminal, an electric charge setting capacitor, an electric charge setting switch connected between the input terminal and the electric charge setting capacitor, a channel separating switch connected between the electric charge setting capacitor and the input terminal of the operational amplifier and a holding switch and a control circuit for selecting one of the electric charge setting channels to hold a signal that is inputted to the input terminal thereof.

10 Claims, 17 Drawing Sheets

MULTI-CHANNEL SAMPLE AND HOLD CIRCUIT AND MULTI-CHANNEL A/D CONVERTER

CROSS REFERENCE TO RELATED APPLICATION

The present application is based on and claims priority from Japanese Patent Applications 2006-285078, filed Oct. 19, 2006, and 2007-154055, filed Jun. 11, 2007, the contents of which are incorporated herein by reference.

BACKGROUND OF THE INVENTION

1. Field of the Invention

The present invention relates to a multi-channel sample and hold circuit that holds a signal sampled or selected from signals of a plurality of channels and a multi-channel A/D converter that uses the multi-channel sample and hold circuit.

2. Description of the Related Art

JP-2007-36580-A discloses an A/D converter that is used in a vehicle engine ECU (electric control unit), body ECU or the like. Such an A/D converter converts analog output signals of various sensors used for engine control and body control, circuit voltage of the ECU's and battery voltage into digital signals. Because the number of the analog signals to be converted may amount to tens or more, it is not practical for an IC chip to form thereon as many A/D converters as the analog signals to be converted because of much increase of the mounting surface area of the IC chip.

As shown in FIG. 17, an IC 101 usually includes a multiplexer 102 and an A/D converter 103. The A/D converter 103 converts a signal that is selected by the multiplexer 102 from signals of a plurality of sensors 104a, 104b, 104c. For this purpose, the A/D converter 103 is allotted to each of three channels Ch1, Ch2 and Ch3 in a time sharing mode.

The A/D converter 103 is connected to the multiplexer 102 by a common line 105. The multiplexer 102 is constructed of analog switches 111, 121, 131, and the A/D converter 103 includes a sample and hold circuit 106. The analog switches 111, 121, 131 are respectively connected to sensors 104a, 104b, 104c via signal terminals 110, 120, 130 and the channels Ch1, Ch2, Ch3.

Incidentally, there is a sensor that has a high output impedance. For example, a knock sensor, which is made of piezoelectric ceramics, has an output impedance of more than 100 kΩ. Usually, resistors Rex1, Rex2, Rex3 are respectively inserted between the sensors 104a, 104b, 104c and the signal terminals 110, 120, 130 so as to prevent surge noises from getting into the IC 101 via a wire harness connecting the sensors 104a, 104b, 104c with an ECU.

Further, because the common line 105 of the multiplexer 102 is connected with analog switches 111, 121, 131, the common line 105 has to have a sufficient capacity to feed the transistors of the analog switches 111, 121, 131. Besides, the common line 105 increases its length as the number of the channels Ch1, Ch2, Ch3 increases. That is, the common line 105 increases its stray capacitance Ccom, which may amount to 5 pf. On the other hand, there are stray capacitances of several pf between each of the signal terminals 110, 120 130 and the ground.

The stray capacitance Ccom is charged by the line voltage of the common line 105 when an A/D conversion is carried out through one of the channels Ch1, Ch2, Ch3. If the output impedance of the sensor is very high, the stray capacitance Ccom is not fully charged in a sampling time, resulting in an error of A/D conversion.

This error can be prevented if external capacitors Cex1, Cex2, Cex3 are connected between the channels Ch1, Ch2, Ch3 and the ground to add capacitance to stray capacitances Ct1, Ct2, Ct3 of the signal terminals 110, 120, 130, thereby increasing the capacitance of the signal terminals 110, 120, 130. However, as the number of the channels increases, the number of the external capacitors increases, so that the mounting surface area+ of a printed board of the ECU increases.

JP-2002-111461-A discloses a circuit for pre-charging the common line that can prevent the above-stated problem. However, it is necessary to provide a voltage follower for each channel, which increases the mounting surface of the IC chip.

SUMMARY OF THE INVENTION

Therefore, an object of the invention is to provide a multi-channel sample and hold circuit.

According to a feature of the invention, a multi-channel sample and hold circuit includes an operational amplifier, plural electric charge setting channels each of which includes an input terminal, an electric charge setting capacitor, an electric charge setting switch connected between the input terminal and the electric charge setting capacitor, a channel separating switch connected between the electric charge setting capacitor and the input terminal of the operational amplifier and a holding switch and a control circuit for selecting one of the electric charge setting channels to hold a signal that is inputted to the input terminal thereof. The above control circuit turns off the electric charge setting switch of the selected channel and turns on the holding switch of the selected channel to connect the electric charge setting capacitor of the selected channel between the input and output terminals of the operational amplifier. The control circuit, thereafter, turns off the other channel separating switches and the other holding switches of channels that are not selected by the control circuit to separate the other electric charge setting capacitors from the operational amplifier and turns on the other electric charge setting switches to connect the other electric charge setting capacitors with the other input terminals of the channels that are not selected by the control circuit.

Accordingly, the multi-channel sample and hold circuit can achieve accurate signal holding regardless of variation in capacitance of the electric charge setting capacitors with a single operational amplifier, so that the electric charge setting capacitors and the semiconductor chip can be made compact.

The above-constructed multi-channel sample and hold circuit may include the following features: the operational amplifier may include a differential operational amplifier that has an inverting input terminal connected with a half of the channels, a non-inverting input terminal connected with the other half of the channels, a non inverting output terminal and a non-inverting output terminal; an offset compensation capacitor (CIN) may be connected between the electric charge setting capacitor and the operational amplifier.

According to another feature of the invention, a multi-channel sample and hold circuit includes a plurality of electric charge setting channels, each of which includes an input terminal, electric charge setting means having an electric charge setting capacitor, holding means for outputting a voltage that corresponds to an electric charge of the electric charge setting capacitor, and a multiplexer circuit, for separating the electric charge setting capacitor from the electric charge setting means and connecting the electric charge setting capacitor with the holding means.

According to another feature of the invention, a multi-channel sample and hold circuit includes an operational amplifier, a holding capacitor connected between the input terminal of the operational amplifier and the output terminal thereof, initializing circuit for initializing the holding capacitor, plural electric charge setting channels each of which includes an input terminal, an electric charge setting capacitor, an electric charge setting switch connected between the input terminal and the electric charge setting capacitor, an channel separating switch connected between the electric charge setting capacitor and the input terminal of the operational amplifier and a holding switch, plural reference voltage lines; and a control circuit for selecting one of the electric charge setting channels to hold a signal that is inputted to the input terminal thereof. The control circuit turns off the electric charge setting switch of the selected channel and turns on the channel separating switch and the holding switch of the selected channel to connect the electric charge setting capacitor of the selected channel between one of the reference voltage lines and the input terminal of the operational amplifier. The control circuit, thereafter, turns off the other channel separating switches and the other holding switches of channels that are not selected by the control circuit to separate the other electric charge setting capacitors from the operational amplifier and turns on the other electric charge setting switches to connect the other electric charge setting capacitors with the other input terminals of the channels that are not selected by the control circuit.

The above multi-channel sample and hold circuit may have the following features: the operational amplifier may include a differential operational amplifier that has an inverting input terminal connected with a half of the channels, a non-inverting input terminal connected with the other half of the channels, a non inverting output terminal and a non-inverting output terminal; and the holding capacitor and the initializing circuit are respectively connected between the inverting input terminal and the inverting output terminal and between the non-inverting input terminal and the non-inverting output terminal; and an offset compensation capacitor is connected between the electric charge setting capacitor and the operational amplifier.

According to another feature of the invention, a multi-channel sample and hold circuit includes a plurality of electric charge setting channels, each of which includes an input terminal, electric charge setting means, holding means for outputting a voltage that corresponds to an input signal inputted to the input terminal, and a multiplexer circuit for connecting the electric charge setting capacitor with the holding means. When the input signal is held, the electric charge is shared with or allocated between the electric charge setting means and the holding means.

Another object of the invention is to provide a multi-channel A/D converter using the multi-channel sample and hold circuit.

According to a feature of the invention, a multi channel A/D converter comprising the multi-channel sample and hold circuit as in claim 1 and an A/D converter circuit for converting the output signal of the multi-channel sample and hold circuit to a digital signal.

According to another feature of the invention, a multi-channel A/D converter includes an A/D converter circuit, an operational amplifier, an integrating capacitor connected between the input terminal and the output terminal of the operational amplifier, plural reference voltage sources, an array circuit of a plurality of array capacitors each of which has a first end connectable with the input terminal of the operational amplifier and a second end connectable with one of the reference voltage sources and the output terminal of the operational amplifier, a control circuit and a multi-channel sample and hold circuit including the operational amplifier, plural electric charge setting channels each of which includes a signal input terminal, an electric charge setting capacitor, an electric charge setting switch connected between the signal input terminal and the electric charge setting capacitor, a channel separating switch connected between the electric charge setting capacitor and the input terminal of the operational amplifier and a holding switch, and the control circuit. The control circuit sets a capacitor that is selected from the integrating capacitor and the capacitors of the array circuit an electric charge that corresponds to voltage outputted by the operational amplifier, initializes those of capacitors of channels that are not selected and, thereafter, turns off the holding switch to separates the electric charge setting capacitor from the operational amplifier. The control circuit connects the second end of each of the capacitors of the array circuit with one of the reference voltage sources to redistribute the electric charges while the integrating capacitor is connected between the input terminal of the operational amplifier and the output terminal thereof and carries out A/D conversion by the A/D converter circuit (58) of the residual voltage outputted from the operational amplifier, electric charge setting by the residual voltage, initializing the capacitors and redistributing the electric charges as many time as necessary. The control circuit, thereafter, turns off the channel separating switches and the holding switches of channels that are not selected to separate electric charge setting capacitors of the channels that are not selected from the operational amplifier and turns on the electric charge setting switches of the channels that are not selected.

Thus, because only a single operational amplifier is sufficient to carry out multi-channel A/D conversion, the size of the multi-channel a/D converter can be made compact.

In the above multi-channel A/D converter, the array circuit may include a first switch connected between the first ends of the capacitors and the input terminal of the operational amplifier and a second switch connected between the first ends of the array capacitors and a reference voltage source, and the control circuit turns off the first switch and turns on the second switches to set an electric charge to the electric charge setting capacitor of the channel that is selected and to initialize the electric charge setting capacitors of the channel that are not selected. The control circuit, thereafter, turns off the second switch, turns on the first switch and connects the integrating capacitor between the input terminal of the operational amplifier and the output terminal thereof to redistribute the electric charge to the array capacitors. The control circuit, thereafter, turns off the first switch and turns on the second switch to set electric charges to the array capacitors.

According to another feature of the invention, a multi-channel A/D converter includes an A/D converter circuit, an operational amplifier, a control circuit, a multi-channel sample and hold circuit including the operational amplifier, a plurality of electric charge setting channels each of which includes a signal input terminal, a first electric charge setting capacitor, an electric charge setting switch connected between the signal input terminal and the first electric charge setting capacitor, an channel separating switch connected between the first electric charge setting capacitor and the input terminal of the operational amplifier and a holding switch for connecting the first electric charge setting capacitor between the input and output terminals of the operational amplifier, and the control circuit, plural reference voltage sources, plural second electric charge capacitors each of which has a first end connectable with the input terminal of the operational amplifier and a second end connectable with one of the reference voltage sources and the output terminal of the operational amplifier, a first switch connected between the first ends of the second electric charge setting capacitors and the input terminal of the operational amplifier and a second switch connected between the first ends of the array capacitors and a reference voltage source. The control circuit turns off the electric charge setting switch of a selected channel, turns on the holding switch of the selected channel to connect the first electric charge setting capacitor between the input and output terminals of the operational amplifier and turns off the first and second switches to carry out A/D conversion by the A/D converter circuit. The control circuit, thereafter, turns on the first switch to connect the second end of the second electric charge capacitors with one of the reference voltage sources according to the output signal of the A/D converter circuit to redistribute the electric charge among the integrating capacitor and the second electric charge setting capacitors. The control circuit, then, carries out A/D conversion of the residual voltage outputted from the operational amplifier, setting electric charge to the second electric charge setting capacitors by the residual voltage and redistributing the electric charge among the integrating capacitor and the second electric charge setting capacitors as many time as necessary to carry out the A/D conversion. Then, the control circuit turns off the channel separating switches and the holding switches of channels that are not selected to separate electric charge setting capacitors of the channels that are not selected from the operational amplifier, turns off the first switch and turns oh the electric charge setting switches of the channels that are not selected and the second switch to connect the second ends of the first electric charge setting capacitors of the channels that are not selected with the signal input terminals of the channels that are not selected.

Therefore, the first electric charge setting capacitors can be used as a integrating capacitor, so that the size of the semiconductor chip can be made small.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

Figure 1:
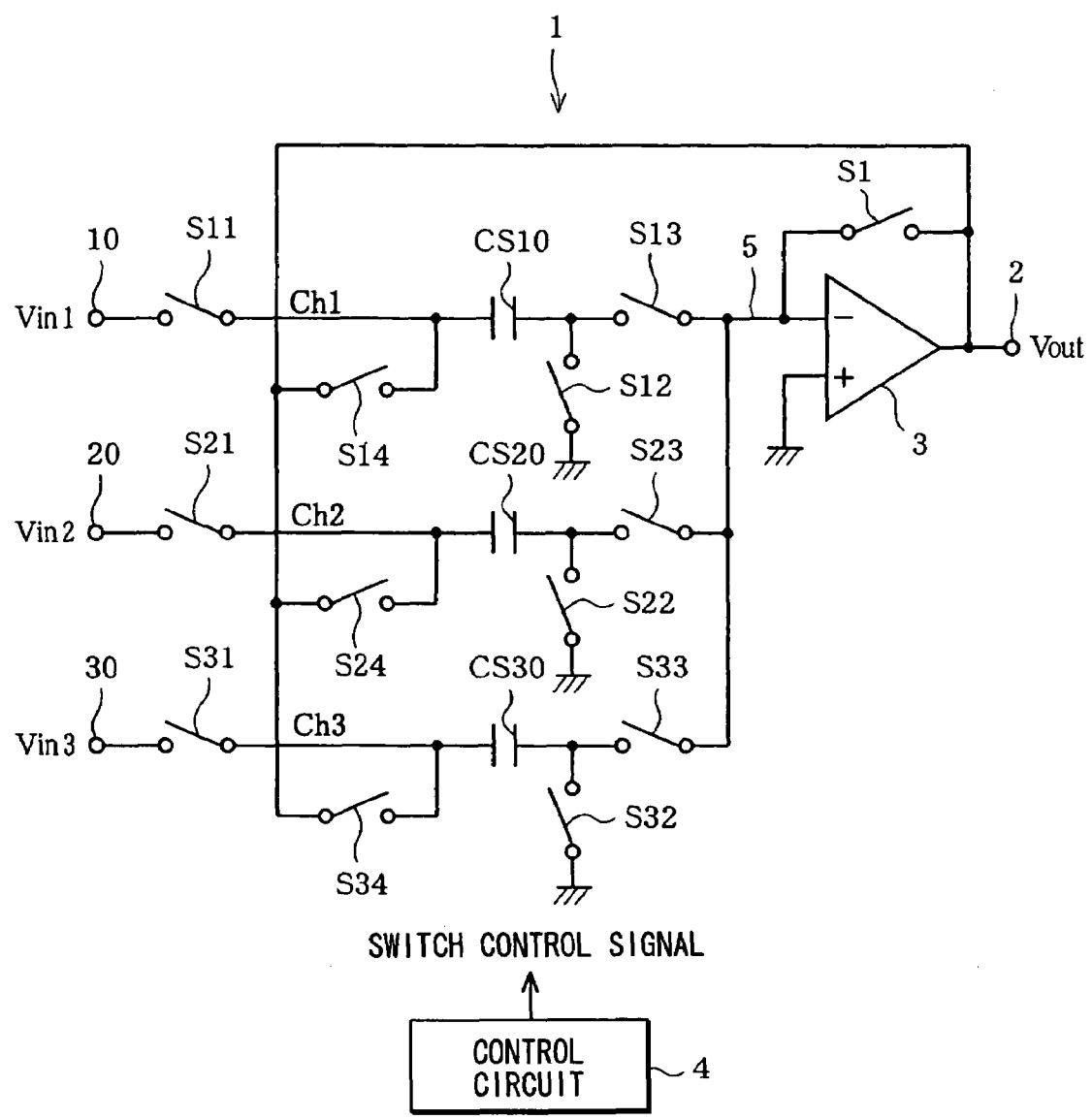
FIG. 1 is a circuit diagram of a multi-channel sample and hold circuit according to the first embodiment of the invention.

Some preferred embodiments according to the present invention will be described with reference to the appended drawings.

A multi-channel sample and hold circuit 1 according to the first embodiment of the invention will be described with reference to FIG. 1.

The multi-channel sample and hold circuit 1 includes an operational amplifier 3, a control circuit 4, three or more channels Ch1, Ch2, Ch3, a common line 5 etc. The operational amplifier 3 has an inverting terminal that is connected with the common line 5, non-inverting terminal that is grounded, an output terminal 2 and a switch S1 that is connected between the input terminal and the output terminal 2. The switch S1 locks the output voltage Vout of the operational amplifier to 0 volt when none of the channel circuits is connected therewith.

The first channel Ch1 includes an input terminal 10 for receiving an input signal Vin1, an electric charge setting circuit that is comprised of a switch (electric charge setting switch) S11, a capacitor (electric charge setting capacitor) CS10 and a switch S12, a switch (channel separating switch) S13 that is connected between one terminal of the capacitor CS10 connected with the switch S12 and the inverting terminal of the operational amplifier 3 and a switch S14 that is connected between the other terminal of the capacitor CS10 and the output terminal 2 of the operational amplifier 3. The second and third channels Ch2, Ch3 are substantially the same in structure as the channel 1. That is, the second channel Ch2 includes an input terminal 20, switch S21, S22, S23, S24 and a capacitor (electric charge setting capacitor) CS20, and the third channel Ch3 includes an input terminal 30, switch S31, S32, S33, S34 and a capacitor (electric charge setting capacitor) CS30.

At the initial stage where none of the channels Ch1, Ch2, Ch3 is selected, the control circuit 4, the switches S11, S12, S21, S22, S31, S32 and S1 are turned on and the switches S13, S14, S23, S24, S33, S34 are turned off. Therefore, the capacitors CS10, CS20, CS30 are disconnected from the operational amplifier 3 to be charged with electric charges that respectively correspond to the input signals Vin1, Vin2, Vin3. The operational amplifier 3 operates as a voltage follower whose output voltage is 0.

When the first channel Ch1 is selected (sampled or multiplexed) to hold the input signal Vin1, the control circuit 4 turns off the switches S11, S12 and S1 and, then, turns on the switches S13 and S14. Accordingly, the capacitor CS10, which is charged with the input signal Vin1, is connected with the inverting input terminal and the output terminal 2 of the operational amplifier 3. As a result, the input signal Vin1 is held by the operational amplifier 3 and it is outputted as an output signal Vout thereof from the output terminal 2.

When the second channel Ch2 is selected to hold the input signal Vin2 instead of the channel Ch1, the control circuit 4 turns off the switches S13, S14 and S22 and, then, it turns on the switches S11, S12, S23 and S24. Accordingly, the capacitor CS20, which is charged with the input signal Vin2, is connected with the inverting input terminal and the output terminal 2 of the operational amplifier 3, so that the input signal Vin2 is held by the operational amplifier 3 and outputted as an output signal Vout thereof from the output terminal 2. In the meantime, the capacitor CS10 is charged with an electric charge that corresponds to the input signal Vin1.

Thus, while one of the capacitors CS10, CS20, CS30 of the channels is holding one of the input signals Vin1, Vin2, Vin3, electric charges that respectively correspond to the input signals of the other channels can be charged to the rest of the capacitors CS10, CS20, CS30 of the other channels. Accordingly, even if an input signal source has a high impedance, the input signal is accurately sampled by the other channels. An analog sensor signal is usually converted into a digital signal in a period of several milliseconds, which is sufficient to secure the sampling time.

In the period of holding, fully charged capacitor (e.g. CS10) is directly connected across the inverting input terminal of the operational amplifier 3 and the output terminal 2 thereof to function as a hold capacitor. The common line 5 becomes 0 volt during the period of sampling in all of the channels and during the period of holding by one of the channels. Therefore, even if there is a stray capacitance around the common line, no error is caused due to electric charge distribution or variation of the capacitor CS10, CS20, CS30.

The capacitance of the capacitors CS10, CS20, CS30 can be made very small, such as 1 pF. It is possible to reduce time of charging the capacity even if the input signal source has a high impedance. Thus, a highly accurate sample-holding can be attained together with reduction in size of the capacitors, resulting in reduction of the size of the chip.

A multi-channel sample and hold circuit 6 according to the second embodiment of the invention will be described with reference to FIG. 2.

Incidentally, the same reference numeral as the preceding embodiment will represents the same or substantially the same part, portion or component of the preceding embodiment, hereafter.

The multi-channel sample and hold circuit 6 includes the operational amplifier 3, a control circuit 7, the three or more channels Ch1, Ch2, Ch3, the common line 5, etc. The operational amplifier 3 and a hold capacitor CF that is connected in parallel with the switch S1 jointly function as a holding circuit 8.

The first channel Ch1 includes the input terminal 10 for receiving an input signal Vin1, an electric charge setting circuit that is comprised of the switch S11, the capacitor CS10 and the switch S12, the switch 13 that is connected between one terminal of the capacitor CS10 and the inverting terminal of the operational amplifier 3 and a switch S15 that is connected between the other terminal of the capacitor CS10 and the ground. The second and third channels Ch2, Ch3 are substantially the same in structure as the channel 1. That is, the second channel Ch2 includes the input terminal 20, the switches S21, S22, S23, a switch S25 and the capacitor CS20. The third channel Ch3 includes the input terminal 30, switch S31, S32, S33, a switch S35 and the capacitor CS30.

The capacitors CS10, CS20, CS30 respectively set electric charges that correspond to the input signals Vin1, Vin2, Vin3. The operational amplifier 3, the capacitor CF and the switch S1 jointly function as a holding circuit. The switches S11, S12, S21, S22, S31, S32 respectively function switches for switching the capacitors CS10, CS20, CS30 on or off. The switches S13 and S15 function as a channel separating switch that switches the connection between the capacitor CS10 and the operational amplifier 3 on or off and as a hold switch that inserts the capacitor CS10 between the inverting terminal of the operational amplifier 3 and the ground. The switches S13, S15 jointly function as a multiplexer for connecting the holding circuit 8 with the capacitor CS10. The switches S23, S25 and also the switch S33, S35 respectively function as multiplexers for connecting the holding circuit 8 with the capacitor CS20 and CS30.

When none of the channels Ch1, Ch2, Ch3 is selected or all of the channels are in the state of sampling, the control circuit 7 turns on the switches S11, S12, S21, S22, S31, S32 and S1 and turns off the switches S13, S15, S23, S25, S33, S35. Therefore, the capacitors CS10, CS20, CS30, which are disconnected from the operational amplifier 3, are charged with electric charges that respectively correspond to the input signals Vin1, Vin2, Vin3. The operational amplifier 3 operates as a voltage follower, whose output voltage becomes 0 volt, and the electric charge of the capacitor CF becomes 0.

When the channel Ch1 is selected or multiplexed to hold the input signal Vin1, the control circuit 7 turns off the switches S11, S12, and S1 and turns on the switches S13 and S15. Accordingly, the capacitor CS10, which is charged with the input signal Vin1, is connected with the inverting terminal of the operational amplifier 3, and the electric charge of the capacitor CS10 is redistributed to the capacitors CS10 and CF. As a result, the output voltage Vout of the operational amplifier 3 is expressed by the following expression:

$$\text{Vout} = (CS10/CF) \cdot \text{Vin1} \tag{1}$$

When the first channel Ch2 is selected to hold the input signal Vin2 instead of the channel Ch1, the control circuit 7 turns off the switches S13, S15 and, then, turns on the switches S11, S12, and S1 to fully discharge the capacitor CF.

Thereafter, the control circuit 7 turns off the switch S1, S21, S22 and turns on the switches S23, S25. Accordingly, the capacitor CS20, which is charged with the input signal Vin2, is connected between the inverting terminal of the operational amplifier 3 and the ground, so that the electric charge of the capacitor CS 20 is redistributed to the capacitors CS20 and CF. As a result, the output voltage Vout of the operational amplifier 3 is expressed by the following expression:

$$\text{Vout} = (CS20/CF) \cdot \text{Vin2} \tag{2}$$

Thus, while one of the capacitors CS10, CS20, CS30 of the channels is holding one of the input signals Vin1, Vin2, Vin3, electric charges that respectively correspond to the input signals of the other channels can be charged to the rest of the capacitors CS10, CS20, CS30 of the other channels, as in the first embodiment.

A multi-channel sample and hold circuit 51 according to the third embodiment of the invention will be described with reference to FIG. 3.

The sample and hold circuit 51 has a differential structure that includes an inverting-side circuit and a non-inverting-side circuit, each of which is almost the same in structure as the sample and hold circuits according to the first embodiment shown in FIG. 1, except for the operational amplifier 3 and the control circuit 4. Instead, the sample and hold circuit 51 includes a differential type operational amplifier 52 and a control circuit 53. The operational amplifier 52 has a non inverting input terminal connected with a common line 5p, an inverting input terminal connected with a common line 5m, a non-inverting output terminal 2p and an inverting output terminal 2p. A switch S1p is connected between the non-inverting input terminal of the operational amplifier 52 and the non-inverting output terminal 2p, and a switch S1m is connected between the inverting input terminal and the inverting output terminal 2m.

The non-inverting-side circuit includes input terminals 10p, 20p, 30p, switches S11p-S34p and capacitors CS10p, CS20p, CS30p and is connected to the non-inverting terminal of the operational amplifier 52. The inverting-side circuit includes input terminals 10m, 20m, 30m switches S11m-S34m and capacitors CS10m, CS20m, CS30m and is connected to the inverting terminal of the operational amplifier 52.

With the above sample and hold circuit 51, it is possible to sample-hold differential output signals of sensors mounted on a vehicle. Even if erroneous electric charges get into the sample and hold circuit 51 due to operation of any of the switches, they are canceled because the inverting-side circuit and the non-inverting side circuit are arranged to be symmetrical and are operated concurrently.

A multi-channel sample and hold circuit 54 according to the fourth embodiment of the invention will be described with reference to FIG. 4.

Figure 2:
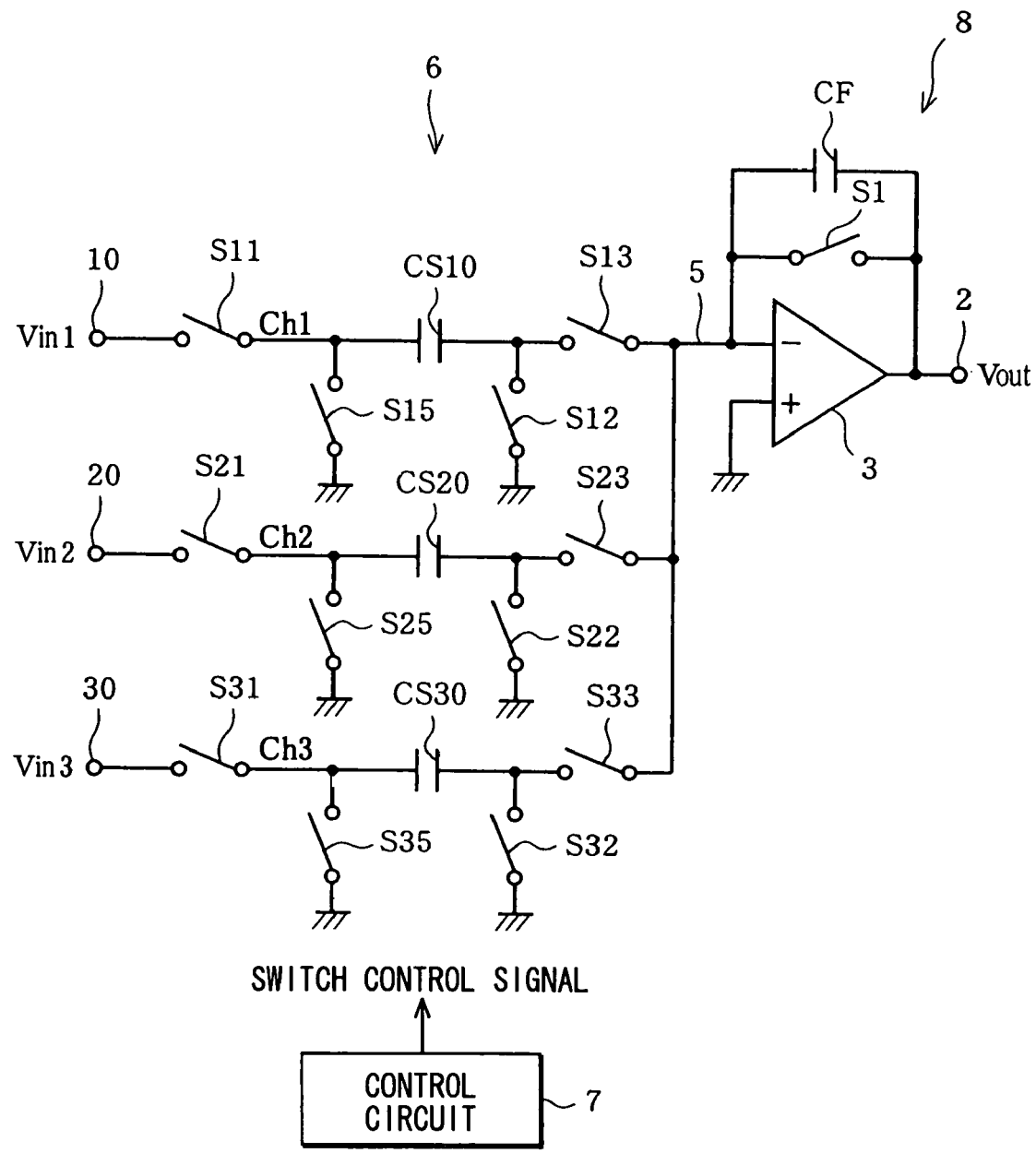
FIG. 2 is a circuit diagram of a multi-channel sample and hold circuit according to the second embodiment of the invention.

The sample and hold circuit 54 has a differential structure that includes an inverting-side circuit and a non-inverting-side circuit, each of which is almost the same in structure as the sample and hold circuit according to the second embodiment shown in FIG. 2 except for the control circuit 7 and the holding circuit 8. Instead, the sample and hold circuit 54 includes the same differential type operational amplifier 52 as the third embodiment and a control circuit 55. A parallel circuit of a hold capacitor CFp and a switch S1p is connected between the non-inverting terminal of the operational amplifier 52 and the non-inverting output terminal 2p, and a parallel circuit of a hold capacitor CFm and a switch S1m is connected between the inverting input terminal and the inverting output terminal 2m.

With the above sample and hold circuit 54, it is possible to sample-hold differential type output signals of sensors mounted on a vehicle, as in the third embodiment.

A multi-channel recursive A/D converter 56 according to the fifth embodiment of the invention will be described with reference to FIGS. 5-8.

The A/D converter 56 includes the same multi-channel (but four-channel instead of three-channel) sample and hold circuit 57 shown in FIG. 1, a 3-bit A/D converter circuit 58, a 3-bit multiplying D/A converter 59 (or residual voltage forming circuit) and a control circuit 60. The multi-channel sample and hold circuit 57 holds one of the input signals Vin1, Vin2, Vin3, Vin4 of the input terminals 10, 20, 30, 40 to be A/D-converted to have a 6-digit signal. The operational amplifier 3 and the switch S1 of the sample and hold circuit 57 is also included in the multiplying D/A converter 59.

The multiplying D/A converter 59 includes the operational amplifier 3, a capacitor array circuit 61, a capacitor CF, switches S1-S5, S50-S57. The capacitor array circuit 61 has eight array capacitors CS50-CS57 having the same electric capacitance and a common line 5a that is connected with one end (first end) of each one of the eight array capacitors CS50-CS57. The other end (second end) of each one of the capacitors CS50-CS57 is connected with one of three different reference voltage lines via one of the switches S50-S57.

The common line 5a is connected with the inverting terminal of the operational amplifier 3 via the switch S2 and the ground via the switch S3. The switch S1 is connected between the inverting input terminal of the operational amplifier 3 and the output terminal thereof. Further, a series circuit of the capacitor CF and switch S4 is connected between the inverting input terminal of the operational amplifier 3 and the output terminal thereof. The capacitor CF has twice as much capacitance as one of the capacitors CS50-CS57. The switch S5 may be omitted in case of the arrangement of the capacitor CF and CS50-CS57 for A/D conversion.

Figure 6:
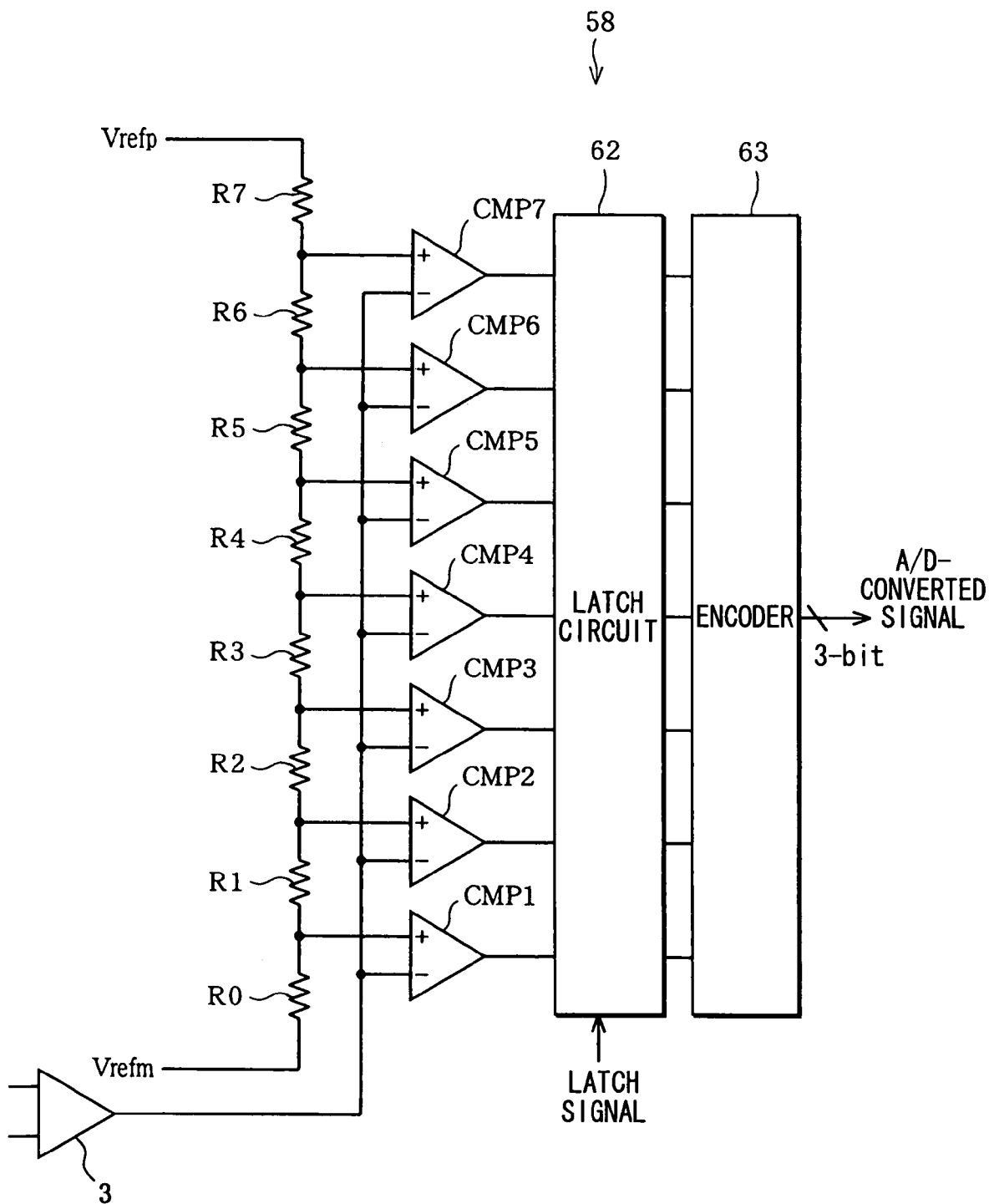
FIG. 6 is circuit diagram of a three bit A/D converter.

As shown in FIG. 6, the A/D converter circuit 58 includes a series circuit of eight resistors R0-R7, seven comparators CMP1-CMP7, a latch circuit 62 and an encoder 63. The A/D converter circuit 58 outputs a 3-bit digital signal based on the reference voltages Vrefp (5V) and Vrefm (0V) respectively applied to two reference voltage lines. The series circuit of eight resistors R0-R7 is connected between the reference voltage lines to which the reference voltages Vrefp (5V) and Vrefm (0V) respectively applied. The non-inverting input terminal of each of the comparators CMP1-CMP7 (e.g. CMP1) is connected to one of the junctions (e.g. the junction of resistor R0 and resistor R1) of the eight resistors R0-R7, and the inverting input terminal of each of the comparators CMP1-CMP7 is connected with the output terminal of the operational amplifier 3. The resistance of each one of the resistors R1-R6 is the same. The resistor R0 has 1.5 times as high resistance as one of the resistors R1-R6, and the resistance R7 has a half resistance of the resistors R1-R6, one of the resistances of the resistors R1-R6

The output signals of the comparators CMP1-CMP7 are inputted to the latch circuit 62. The latch circuit 62 has a latch signal input terminal. When a high level latch signal is inputted to the latch circuit 62 via the latch signal input terminal, the latch circuit 62 holds the output signals of the comparators CMP1-CMP7, which are inputted to the encoder 63. The encoder 63 forms A/D-converted signals within the range between "000" and "111" based on the output signals of the comparators CMP1-CMP7.

Figure 7:
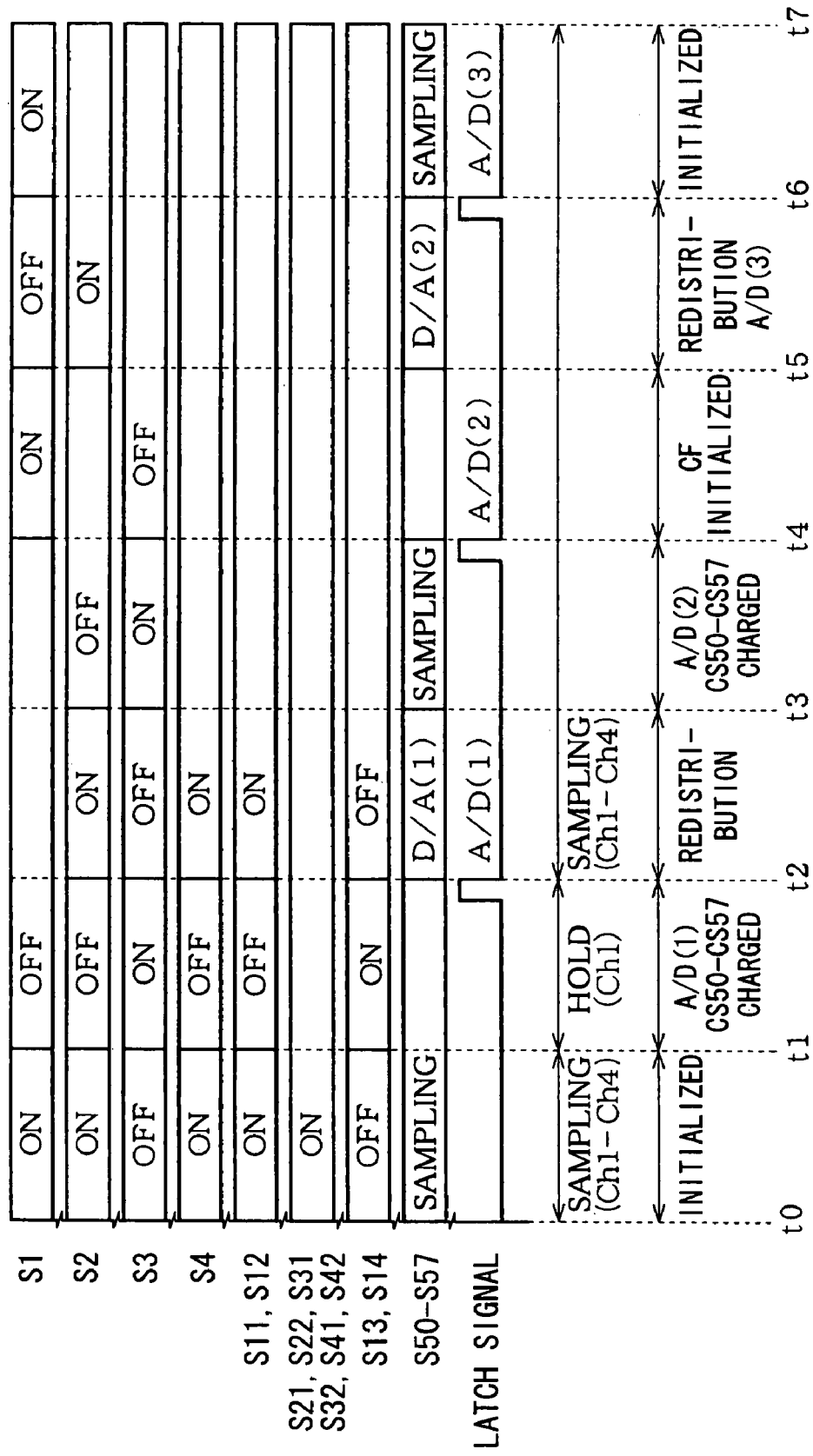
FIG. 7 is a time chart showing operation timings of switches.

The A/D converter circuit 58 operates as shown in FIG. 7. In the initial stage before time t1, the control circuit 60 turns on the switches S11, S12, S21, S22, S31, S32, S41, S42 and S1 and turns off the switches S13, S14, S23, S24, S33, S34, S43 and S44. Therefore, the capacitors CS10, CS20, CS30 and CS40 are disconnected from the operational comparator 3, so that electric charges respectively corresponding to the input signals Vin1, Vin 2, Vin3 and Vin4 are charged into the capacitors CS10, CS20, CS30 and CS40.

On the other hand, the multiplying D/A converter 59 turns on the switches S1, S2 and S4, turns off the switch S3 and switches the switches S50-S57 to connect the second ends of the capacitors CS50-CS57 with the output terminal of the operational amplifier 3. Accordingly, the electric charges of the capacities CF, CS50-CS57 become zero, so that they are initialized.

At time t1, the control circuit 60 turns off the switches S1, S2, S4, of the channel Ch1. Accordingly, the sample and hold circuit 57, selects (or multiplexes) the input signal Vin1 of the channel Ch1 and hold it. Thereafter and just before time t2, the control circuit 60 sends a high level latch signal to the latch circuit 62 of the A/D converter circuit 58 to input the A/D-converted signal to a shift counter (not shown). In this holding period, the capacitors CS50-CS57 are respectively charged with the hold voltage (which corresponds to Vin1)

outputted by the operational amplifier 3, and the capacitor CF maintains its initial state being zero-charged.

The control circuit 60, after turning off the switch S3 at time t2, turns off the switches S13, 14, turns on the switches S2, S11 and S12 and switches the switches S50-S57 to connect the second ends of the capacitors CS50-Cs57 with the reference voltage line Vrefp or Vrefm, as disclosed in JP345812B. Accordingly, the channel Ch1 is brought to the state of sampling and the electric charge is shared again among the capacitor CF and the capacitors CS50-CS57.

Thereafter, the control circuit 60 turns off the switch S2 to hold a residual voltage after the A/D conversion at time t3 and turns on the switch S3. Thereafter, the control circuit 60 sends the high level latch signal just before time t4 to input the second A/D-converted signal to the shift counter to add one bit to the first A/D-converted signal. During the period between time t3 and time t4, the capacitors CS50-CS57 are charged with the residual voltage outputted by the operational amplifier 3.

The control circuit 60 turns off the switch S3 at time t4 to hold the electric charges of the capacitors CS50-CS57 and turns on the switch S1 to fully discharge the electric charge of the capacitor CF. Thereafter, it turns off the switch S1, turns on the switch S2 and switches the switches S50-S57 to connect the second ends of the capacitors CS50-CS57 with the reference line Vrefp or Vrefm according to the second A/D-converted signal. Thereafter, the control circuit 60 sends the high level latch signal just before time t6 to input the third A/D-converted signal to the shift counter to add one bit to the first and second A/D-converted signals. Thus, the A/D conversion in the channel Ch1 ends. A period between time t6 and time t7 is to initialize the capacitor CF by turning on the switch S1.

Figure 8:
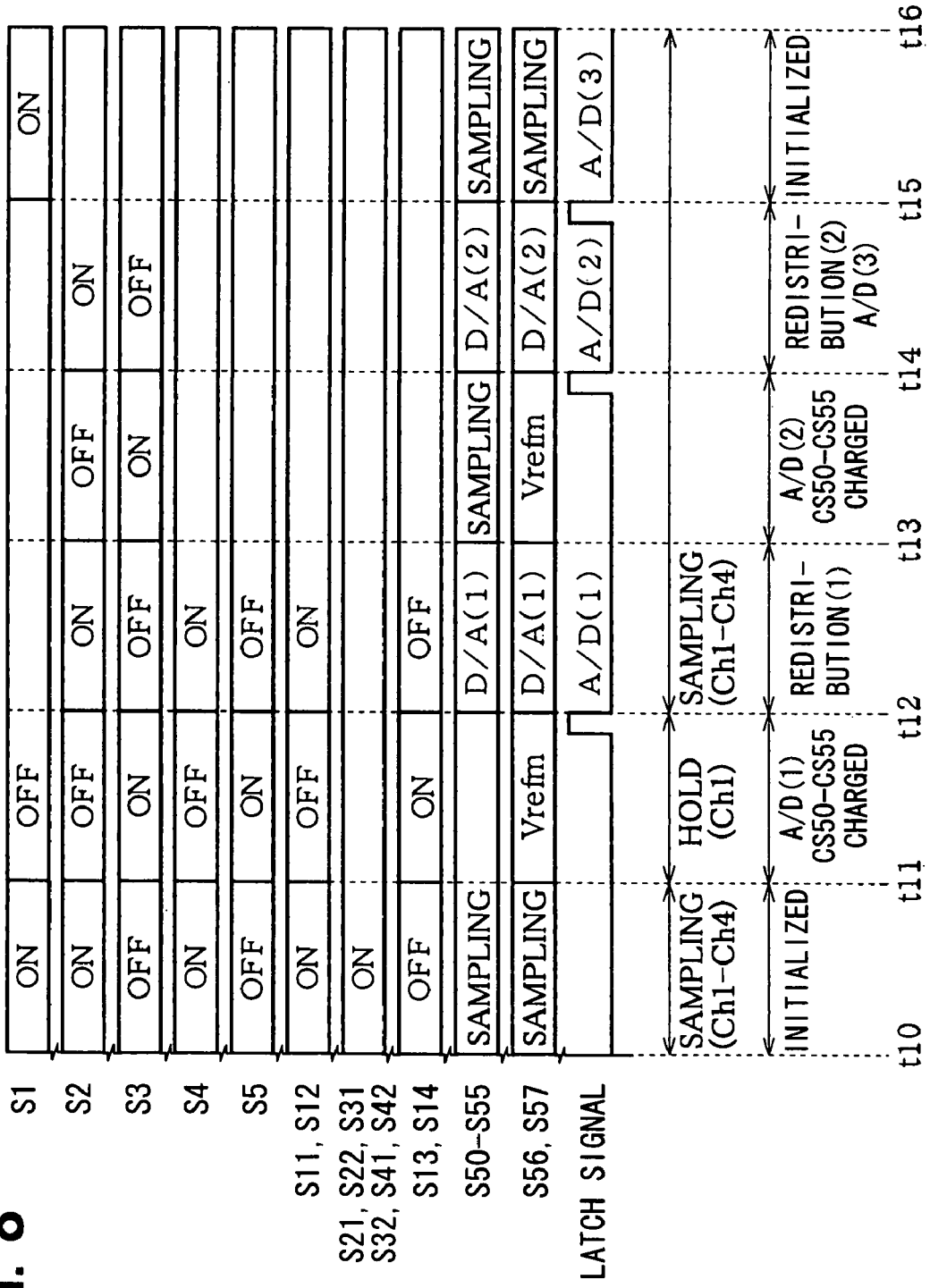
FIG. 8 is a time chart showing operation timings of switches.

The A/D converter circuit 58 may operate as shown in FIG. 8 instead of the operation described above. In the initial stage before time t11, the control circuit 60 turns on the switch S5 so that the capacitor CF is charged by the hold voltage (Vin1) of the operational amplifier 3. On the other hand, two of the switches S50-S57 (e.g. S56 and S57) are switches to connect with the reference line Vrefp or Vrefm. Accordingly, the capacitors CS50-CS55 are respectively charged by the hold voltage (Vin), and the capacitors CS56 and CS57 are fully discharged to be initialized. Therefore, it is not necessary to initialize the capacitor CF at the period between time t4 and time t5 and the period between time t6 and time t7 shown in FIG. 7.

In this embodiment, the size of the A/D converter can be reduced because the operational amplifier 3 is shared with the sample and hold circuit 57 and the multiplying D/A converter 59.

A 10-bit multi-channel recursive A/D converter 64 according to the sixth embodiment of the invention will be described with reference to FIGS. 9-11.

The multi-channel recursive A/D converter 64 includes the same multi-channel (not three-channel but four-channel) sample and hold circuit 57 shown in FIG. 1, a 1.5-bit A/D converter circuit 65, a 1.5-bit multiplying D/A converter 66 and a control circuit 67.

A switch S6 is inserted between the switches S13, S23, S33, S43 and the common line 5b. The switch S6 prevents the speed of A/D-conversion from slowing down due to parasitic capacities of the switches S13, S23, S33, S43.

Figure 10:
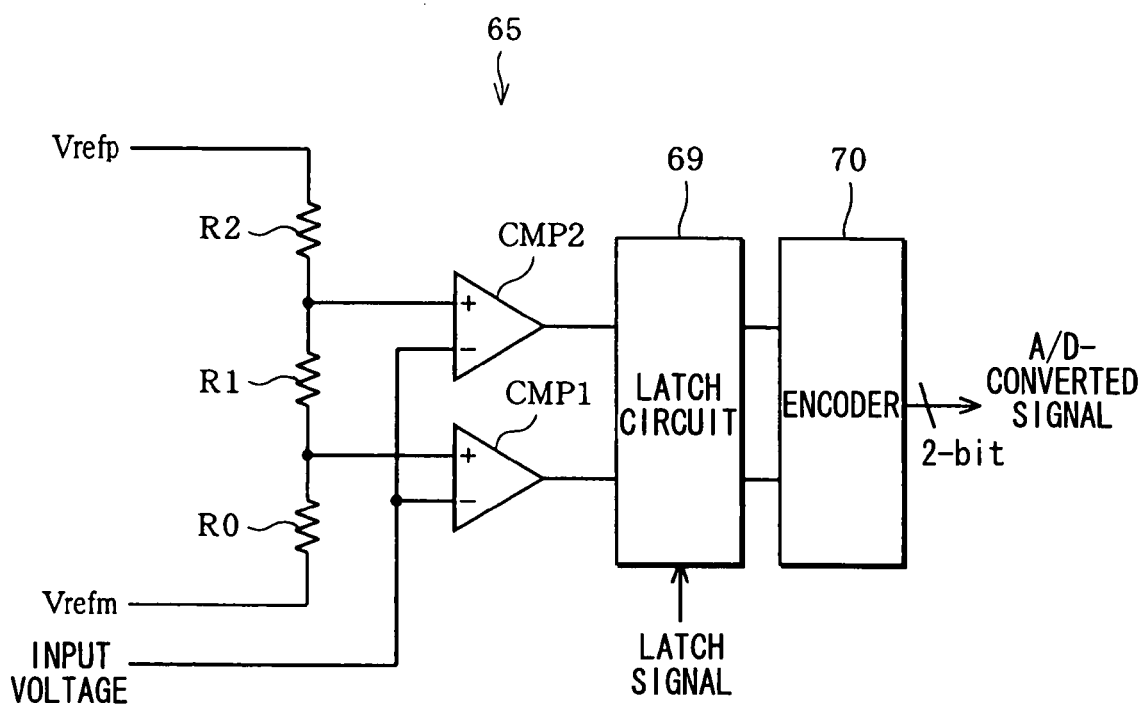
FIG. 10 is a circuit diagram of a 1.5 bit-A/D converter circuit.

As shown in FIG. 10, the 1.5 bit A/D converter circuit 65 is the same in structure as the 3-bit A/D converter circuit 58 shown in FIG. 6 except for the bit size. That is, the A/D converter circuit 65 includes a series circuit of three resistors R0-R2, two comparators CMP1-CMP2, a 2-bit latch circuit 69 and a 2-bit encoder 70.

Figure 11:
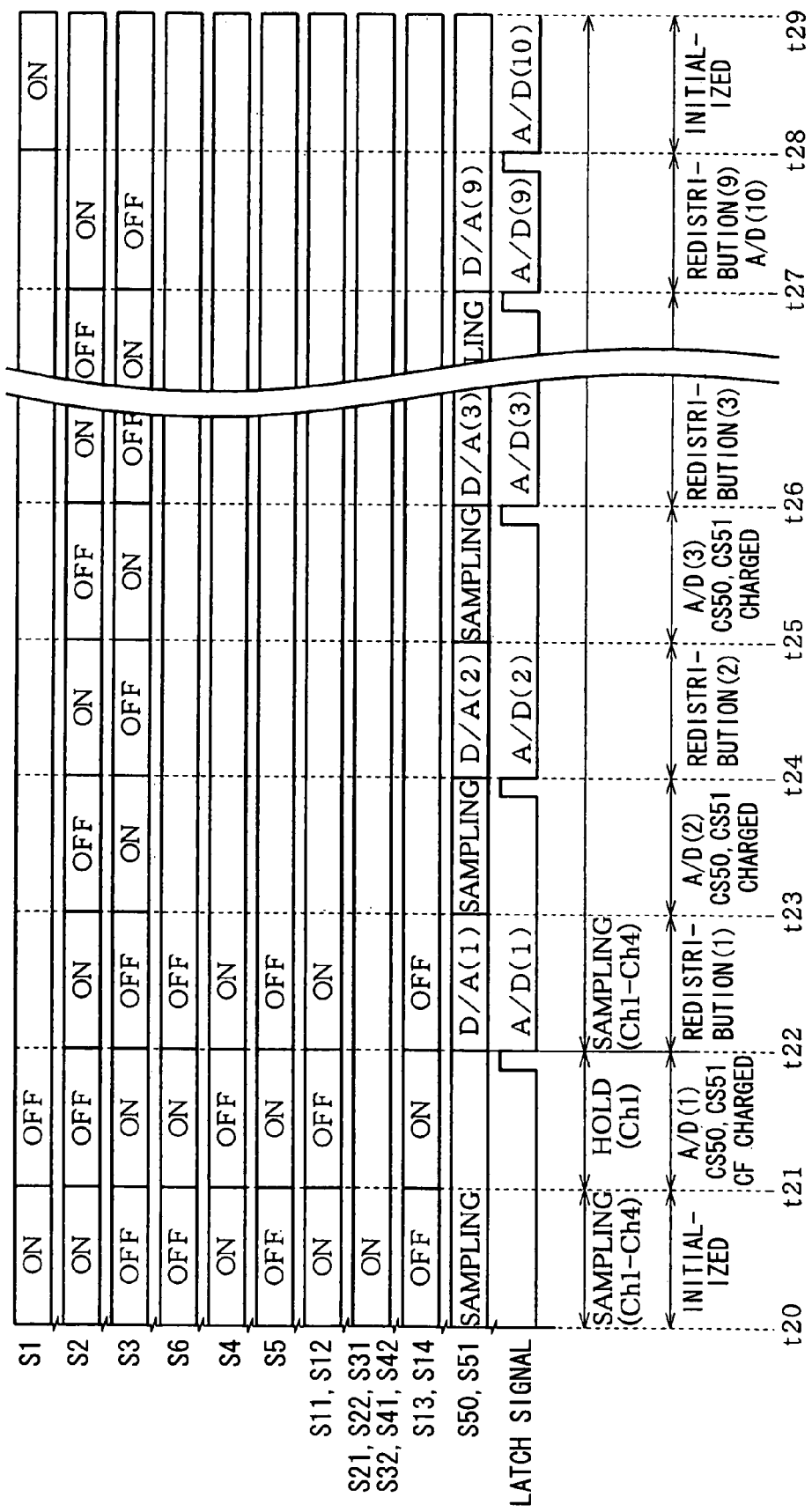
FIG. 11 is a time chart showing operation timings of switches.

The multi-channel recursive A/D converter 64 operates as shown in FIG. 11. The operation timing is almost the same as the operation timing shown in FIG. 8. Therefore, the operation that is different from that shown in FIG. 8 will be described briefly.

At time t21, the control circuit 67 turns on the switch S6 to start signal holding in the channel Ch1. In this holding period, the capacitors CF, CS50, CS51 (with the capacitance of 4C) are charged by the hold voltage (Vin1) outputted by the operational amplifier 3.

The control circuit 67 disconnects the sample and hold circuit 57 from the multiplying D/A converter 66 at time t22 and turn off the switch S6 to disconnect the switches S13, S23, S33, S43 from the common line 5b to reduce the parasitic capacitance of the switches S13, S23, S33, S43. Thereafter, the residual voltage of the operational amplifier, which is formed in the course of electric charge sharing, is applied to the multiplying D/A converter 66 repeatedly up to ten times to have a 10-bit A/D-converted signal at time t28.

Figure 12:
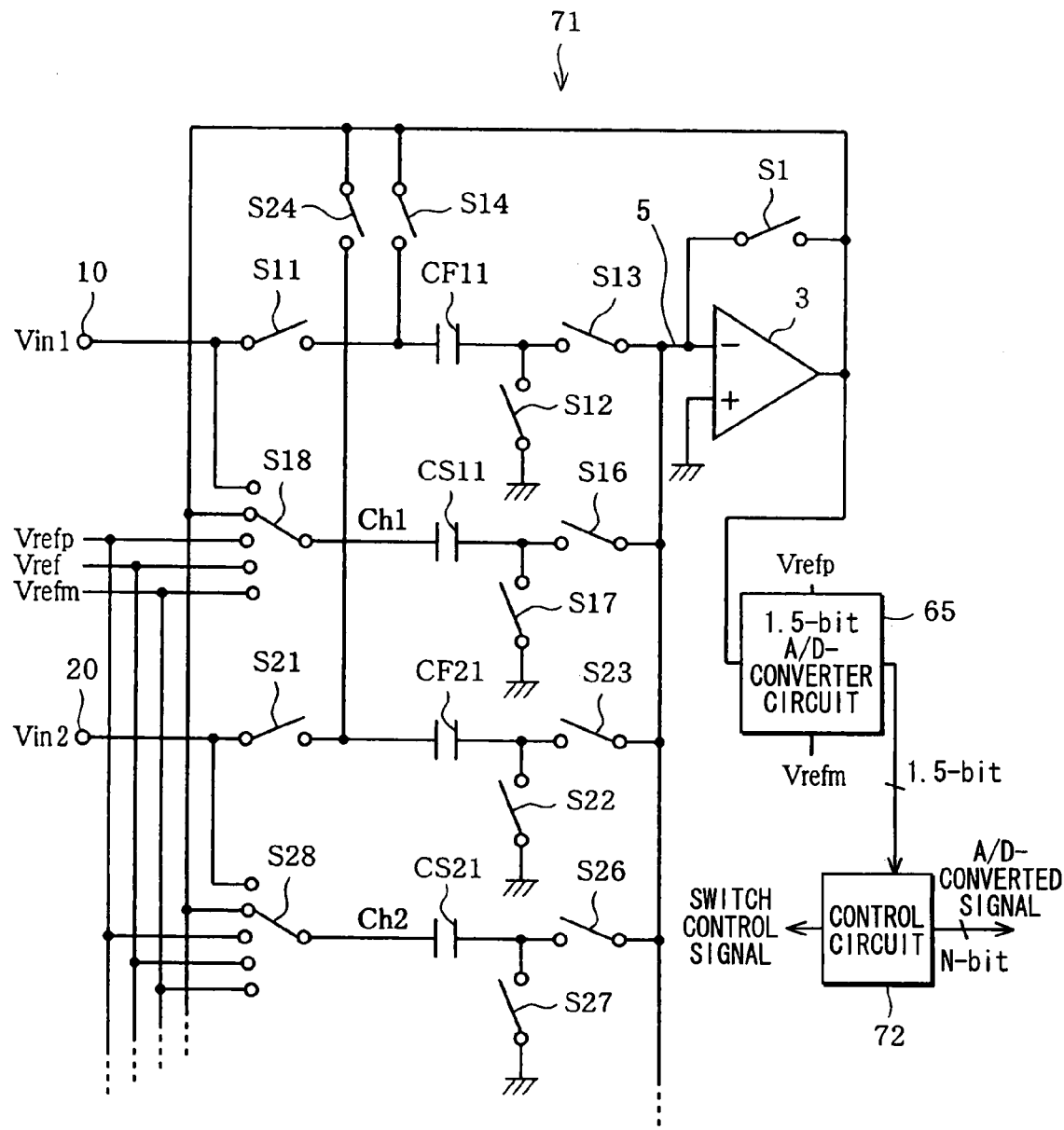
FIG. 12 is a circuit diagram of a multi-channel recursive A/D converter according to the seventh embodiment of the invention.

A 10-bit multi-channel recursive A/D converter 71 according to the seventh embodiment of the invention will be described with reference to FIGS. 12 and 13.

The multi-channel recursive A/D converter 71 includes substantially the same multi-channel sample and hold circuit 57 shown in FIG. 1. The multi-channel recursive A/D converter 71 selects and holds one of plural input signals Vin1, Vin2, . . . , which is A/D-converted to output a 10-bit A/D-converted signal.

The A/D converter 71 includes the same operational amplifier 3 as that of the first embodiment, the same 1.5 bit-A/D converter circuit 65 as that of the sixth embodiment, and a control circuit 72. In this embodiment, the operational amplifier 3, the switch S1, capacitors CF11, CF21 . . . are shared with the sample and hold circuit and the multiplying D/A converter.

Figure 9:
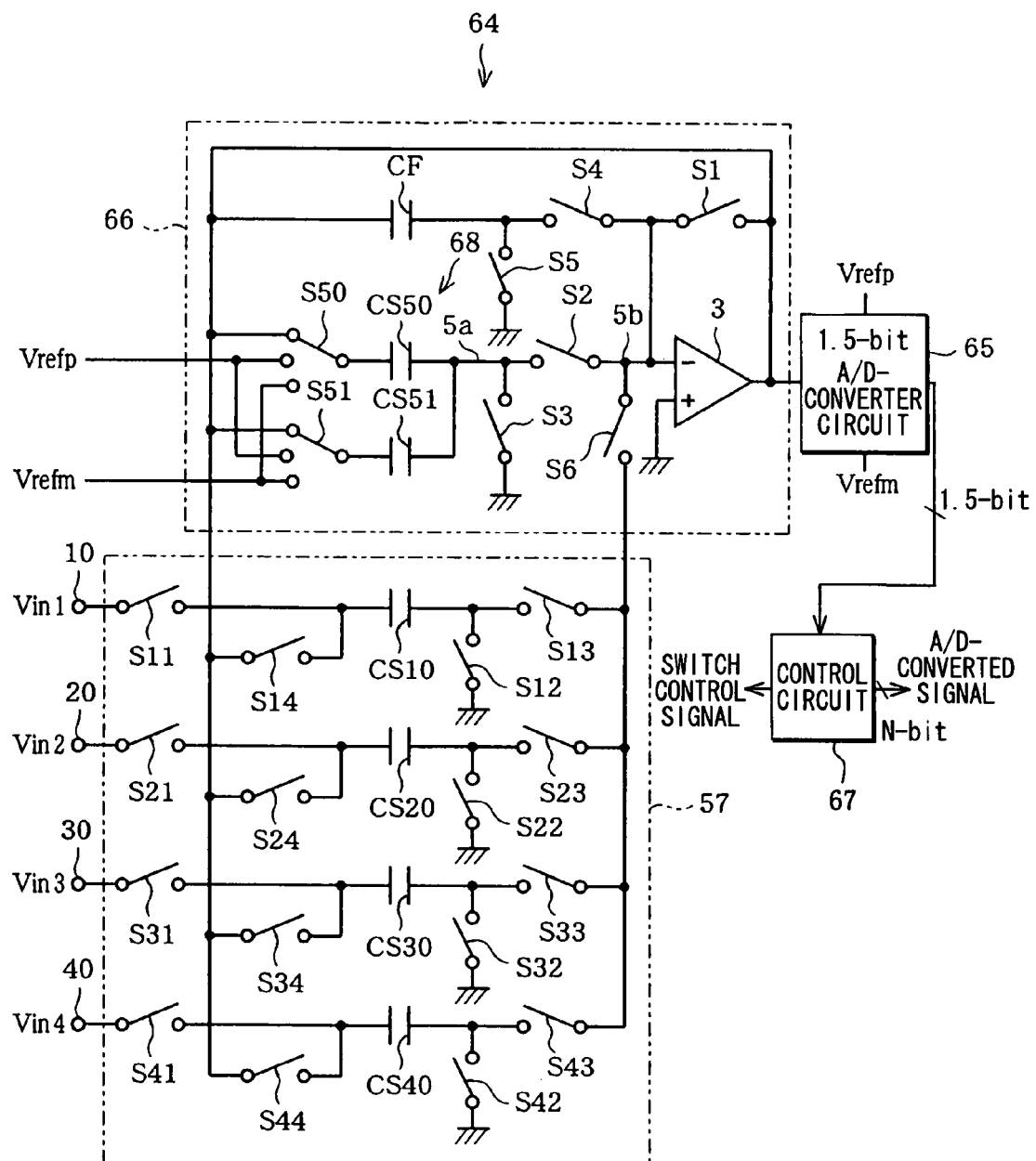
FIG. 9 is a circuit diagram of a multi-channel recursive A/D converter according to the sixth embodiment of the invention.

The capacitor CF11 in the channel Ch1 functions as both the capacitor CS10 of the sample and hold circuit 1 shown in FIG. 1 and the integrating capacitor CF of the multiplying D/A converter 66 shown in FIG. 9. The capacitor CS11 functions as the array capacitors CS50, CS51 of the multiplying D/A converter 66 shown in FIG. 9.

The circuit including the switches S1, S11-S14, the capacitor CF11 and the operational amplifier is the same in structure as the sample and hold circuit shown in FIG. 1. This circuit keeps turning on the switches S13 and S14 and operates the capacitor CF11 as an integrating capacitor (holding capacitor) during the A/D conversion.

The capacitor CS11 of channel Ch1 has a first end connected with the common line 5 via the switch S16 and a second end connected with one of the input terminal 10, the output terminal of the operational amplifier 3 and three reference lines Vrefp (5V), Vref (2.5V), Vrefm (0 v) via a switch S18. In the A/D conversion, the second end of the capacitor CS11 is connected by the switch S18 with one of the three reference lines Vrefp, Vref, Vrefm according to the 3-level A/D-converted signal that is outputted by the 1.5-bit A/D converter circuit 65. A switch S17 is connected between the first end of the capacitor CS11 and the ground.

Other channels Ch2, Ch3 are the same in structure as the channel Ch1.

Figure 13:
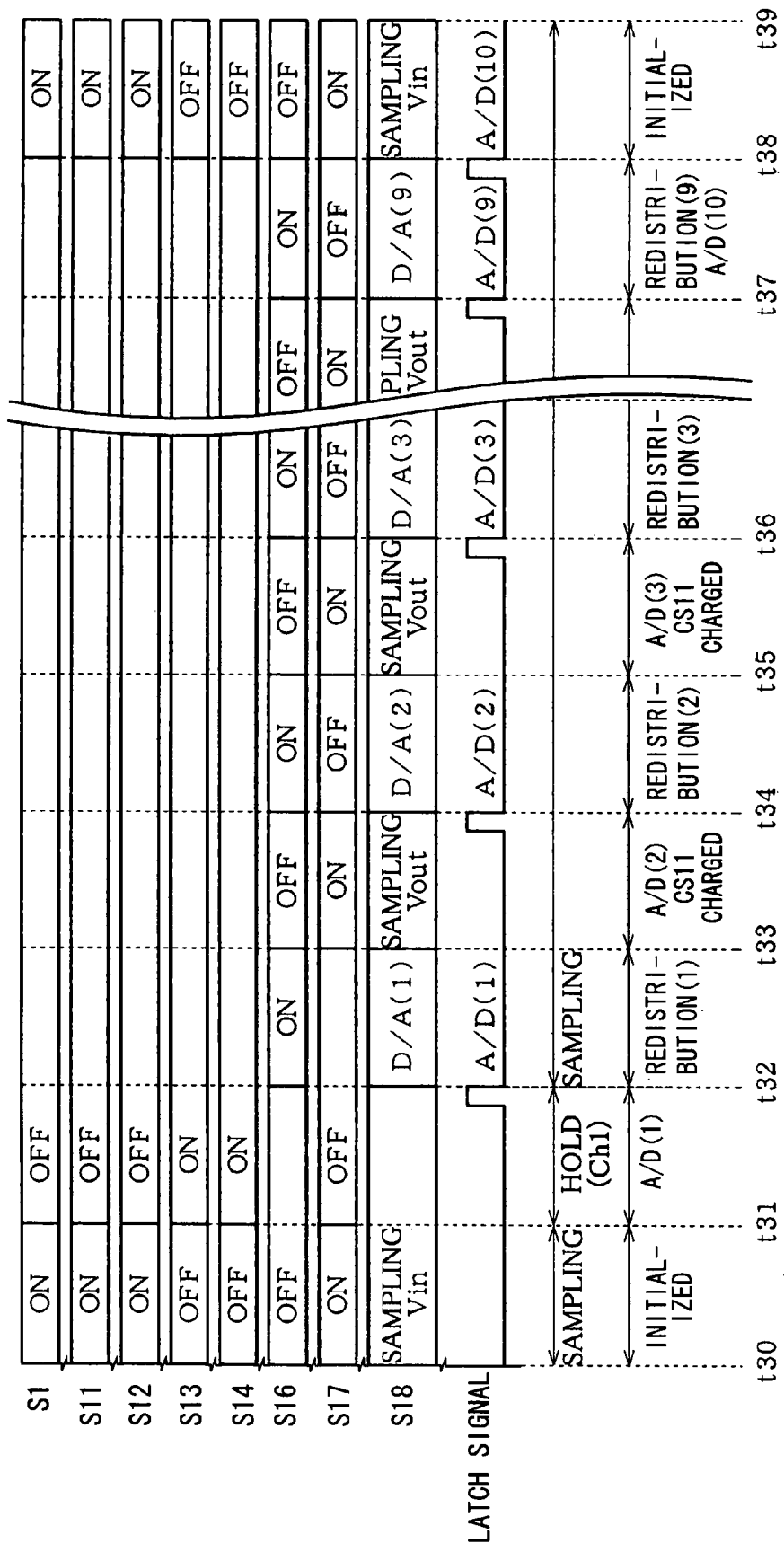
FIG. 13 is a time chart showing operation timings of switches.

As shown in FIG. 13, none of the channels 1, 2, 3 is selected before time t31. The control circuit 72 turns on the switches S1, S12, S17, turns off the switches S13, S14, S16 and switches the switch S18 to connect with the input terminal 10.

Accordingly, the capacitors CF11, CS11 are charged with electric charges that correspond to the input signal Vin1, and the capacitors CF21, CS21 are charged with electric charges that correspond to the input signal Vin2.

The control circuit 72 starts holding of the input signal Vin1 and A/D-conversion thereof in the channel Ch1 at time t31. That is, the control circuit 72 turns off the switches S1, S11, S12, S17 and turns on the switches S13, S14, so that the operational amplifier 3 holds the input single Vin1. In the meantime, the electric charge of the capacitor CS11 is held as it is. After the hold voltage is stabilized, the control circuit 72 sends the latch circuit 69 a high level latch signal just before time t32 to input the first AD-converted signal to a shift counter (not shown). Incidentally, the switch S1, S11-S14 are kept unchanged until the A/D conversion ends.

The control circuit 72 turns on the switch S16 and switches the switch S18 to connect with the reference line Vrefp, Vref or Vrem at time t32 according to the A/D-converted signal. Thus, the electric charges are redistributed to the capacitor CF11 and the capacitor CS11.

After the relocation of the electric charge, the control circuit 72 turns off the switch S16 at time t33 to hold residual voltage of the A/D-conversion, turns on the switch S17 and switches the switch S18 to connect with the operational amplifier 3. Just before time t34, the control circuit 72 sends the latch circuit a high level latch signal to input the second A/D-converted signal to the shift counter to add one more bit to the first A/D-converted signal. The capacitor CS11 is charged by the residual voltage outputted by the operational amplifier 3 in the period between time t33 and time 34.

Thereafter until time t38, the control circuit 72 repeatedly operates the switches S16, S17, S18 to redistribute the electric charges of the capacitor CF11, CS11, carries out the A/D conversion by the A/D converter circuit 65 and charges the capacitor CS11 by the residual voltage to have 10-bit A/D converted signal.

This 10-bit multi-channel recursive A/D converter 71 according to the seventh embodiment of the invention can provide a more compact body size.

Figure 14:
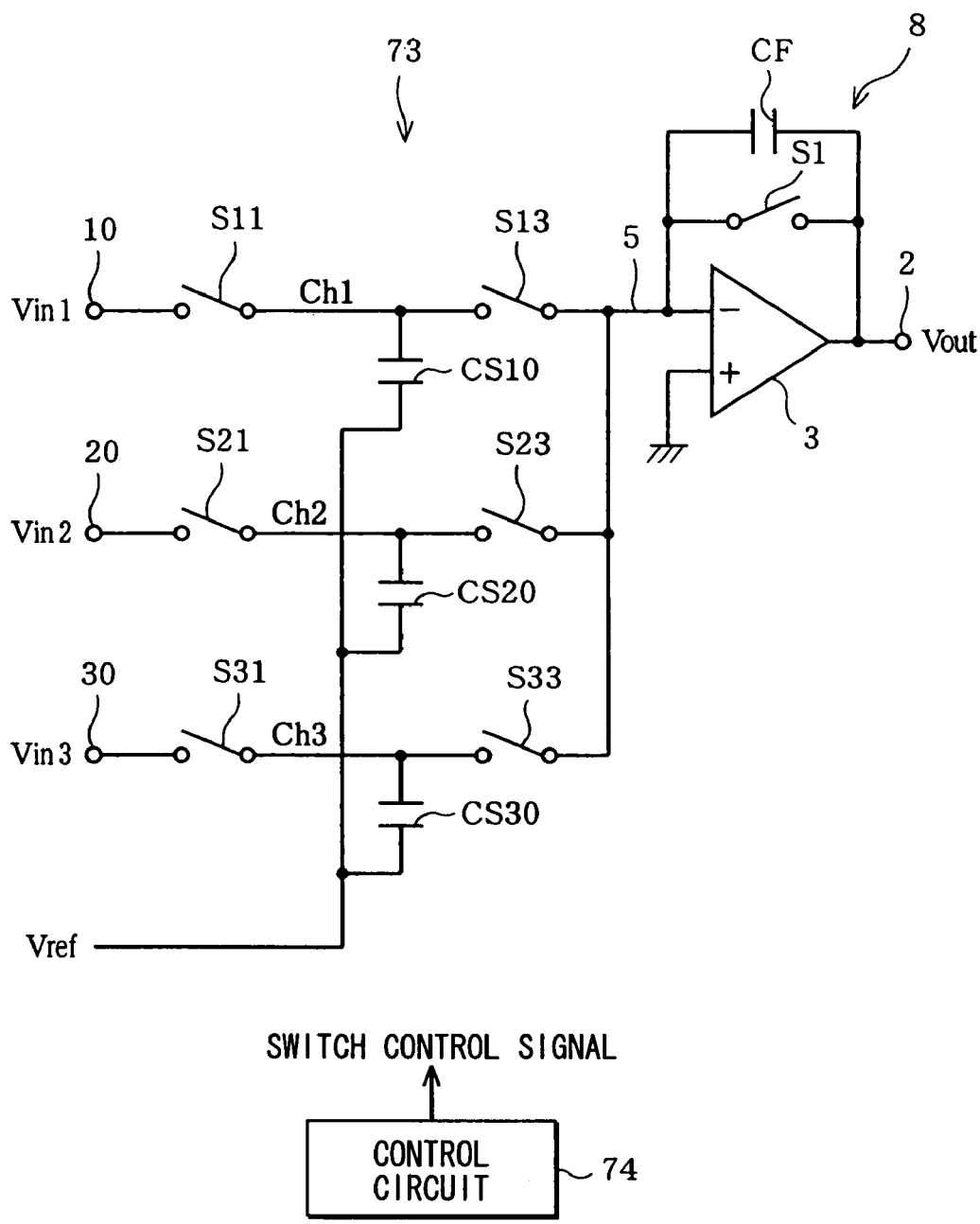
FIG. 14 is a circuit diagram of a multi-channel sample and hold circuit according to the eighth embodiment of the invention.

A multi-channel sample and hold circuit 73 according to the eighth embodiment of the invention will be described with reference to FIG. 14.

The sample and hold circuit 73, which is similar in structure to the sample and hold circuit shown in FIG. 2, includes the operational amplifier 3, a control circuit 74, three or more channels Ch1, Ch2, Ch3, the common line 5 etc. The inverting terminal of the operational amplifier 3 is connected with the common line 5, and the non-inverting terminal thereof is grounded. A parallel circuit of the switch S1 and the capacitor CF is connected between the input terminal of the operational amplifier 3 and the output terminal 2 thereof.

The first channel Ch1 includes the input terminal 10 for receiving an input signal Vin1, an electric charge setting circuit that is comprised of the switch S11, the capacitor CS10, a switch S13 that is connected between one terminal of the capacitor CS10 connected with the switch S13 and the inverting terminal of the operational amplifier 3. The second and third channels Ch2, Ch3 are substantially the same in structure as the channel 1. That is, the second channel Ch2 includes the input terminal 20 for receiving an input signal Vin2, and the third channel Ch3 includes the input terminal 30 for receiving an input signal Vin3.

At the initial stage where none of the channels Ch1, Ch2, Ch3 is selected, the control circuit 74 turns on the switches S11, S 21, S31 and S1 and turns off the switches S13, S23 and S33. Therefore, the capacitors CS10, CS20, CS30 are disconnected from the operational amplifier 3 to be charged with electric charges that respectively correspond to the input signals Vin1, Vin2, Vin3. The operational amplifier 3 operates as a voltage follower whose output voltage is 0.

When the first channel Ch1 is selected to hold the input signal Vin1, the control circuit 74 turns off the switches S11 and S1 and, then, turns on the switches S13. Accordingly, the capacitor CS10, which is charged with the input signal Vin1, is connected between the reference line Ref and the inverting input terminal of the operational amplifier 3 so that the electric charge of the capacitor CS10 is allocated to both the capacitor CS10 and CF. As a result, the output signal Vout of the operational amplifier 3 is expressed as follows.

$$\text{Vout} = -(CS10/CF) \cdot \text{Vin1} \tag{3}$$

When the first channel Ch2 is selected to hold the input signal Vin2 instead of the channel Ch1, the control circuit 74 turns off the switches S13 and turns on the switch S11 to initialize the capacitor CF. Thereafter, the control circuit 74 turns off the switches S1, S21 and turn on the switch S23. Accordingly, the capacitor CS20, which is charged with the input signal Vin2, is connected between the inverting input terminal of the operational amplifier 3 and the reference line Vref, so that the electric charge of the capacitor CS20 is allocated to both the capacitor CS20 and CF. As a result, the output signal Vout of the operational amplifier 3 is expressed as follows.

$$\text{Vout} = -(CS20/CF) \cdot \text{Vin2} \tag{4}$$

Thus, while one of the capacitors CS10, CS20, CS30 of the channels is holding one of the input signals Vin1, Vin2, Vin3, electric charges that respectively correspond to the input signals of the other channels can be charged to the rest of the capacitors CS10, CS20, CS30 of the other channels.

Thus, sample holding can be achieved with a less number of switches than the sample and hold circuit according to the second embodiment of the invention.

Figure 15:
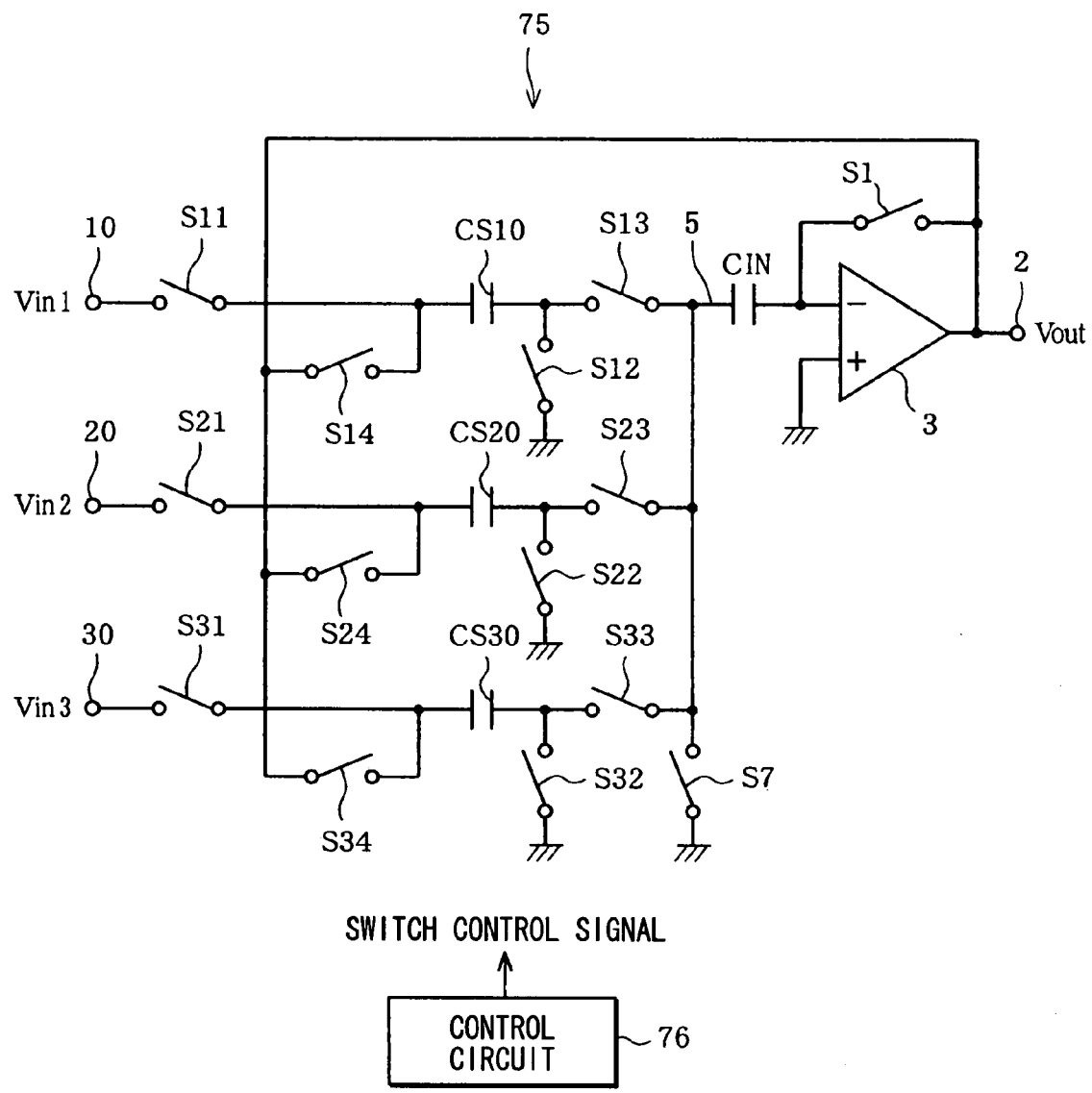
FIG. 15 is a circuit diagram of a multi-channel sample and hold circuit according to the ninth embodiment of the invention.

A multi-channel sample and hold circuit 75 according to the eighth embodiment of the invention will be described with reference to FIG. 15.

The sample and hold circuit 75, which is almost the same in structure as the sample and hold circuit 1 shown in FIG. 1, except for a series-connected capacitor CIN and a switch S7. The series-connected capacitor CIN (offset compensation capacitor) is connected between the inverting terminal of the operational amplifier 3 and the common line 5 to hold an electric charge that corresponds to an offset voltage of the operational amplifier 3, and the switch S7 is connected between the common line 5 and the ground. The sample and hold circuit 75 has a control circuit 76 instead of the control circuit 4

In the state of sampling, the control circuit 76 turns on the switches S1, S12, S21, S22, S31, S32, S1 and S7 and turns off the switches S13, S14, S23, S24, S33 and S34. Accordingly, the capacitors CS10, CS20 and CS30 are respectively charged with electric charges that respectively correspond to the input signals Vin1, Vin2 and Vin3, and the capacitor CIN is charged with an electric charge that corresponds to the offset voltage of the operational amplifier 3.

When, thereafter, the channel Ch1 is selected to hold the input signal Vin1, the control circuit 76 turns off the switches S12, S1 and, immediately thereafter, turns off the switches S11, S7. Accordingly, the capacitor CIN is charged by the hold voltage of the operational amplifier 3. Thereafter, the switches S13, S14 are turned on, so that the capacitor CS10 is connected via the capacitor CIN between the inverting input terminal of the operational amplifier 3 and the output terminal thereof. After a time to settle has passed, the input signal Vin1 held by the capacitor CS10 is outputted as the output voltage Vout from the output terminal 2 of the operational amplifier 3.

Because the capacitor CIN holds an offset voltage of the operational amplifier 3, the operational amplifier 3 can operate with no offset voltage. Thus, the sample and hold circuit 75 according to the ninth embodiment can hold the input signal with very high accuracy.

Figure 16:
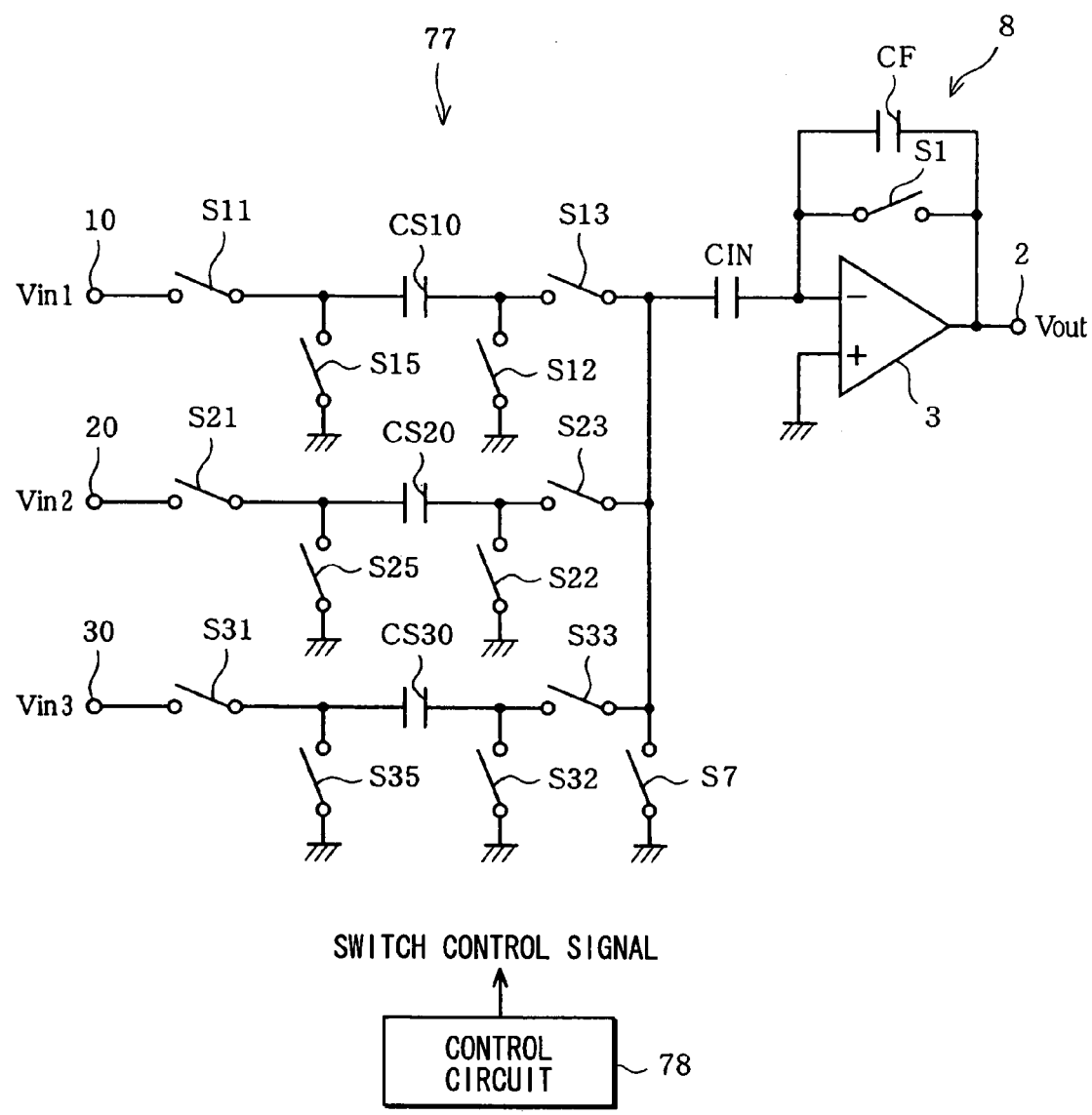
FIG. 16 is a circuit diagram of a multi-channel sample and hold circuit according to the tenth embodiment of the invention.
Figure 17:
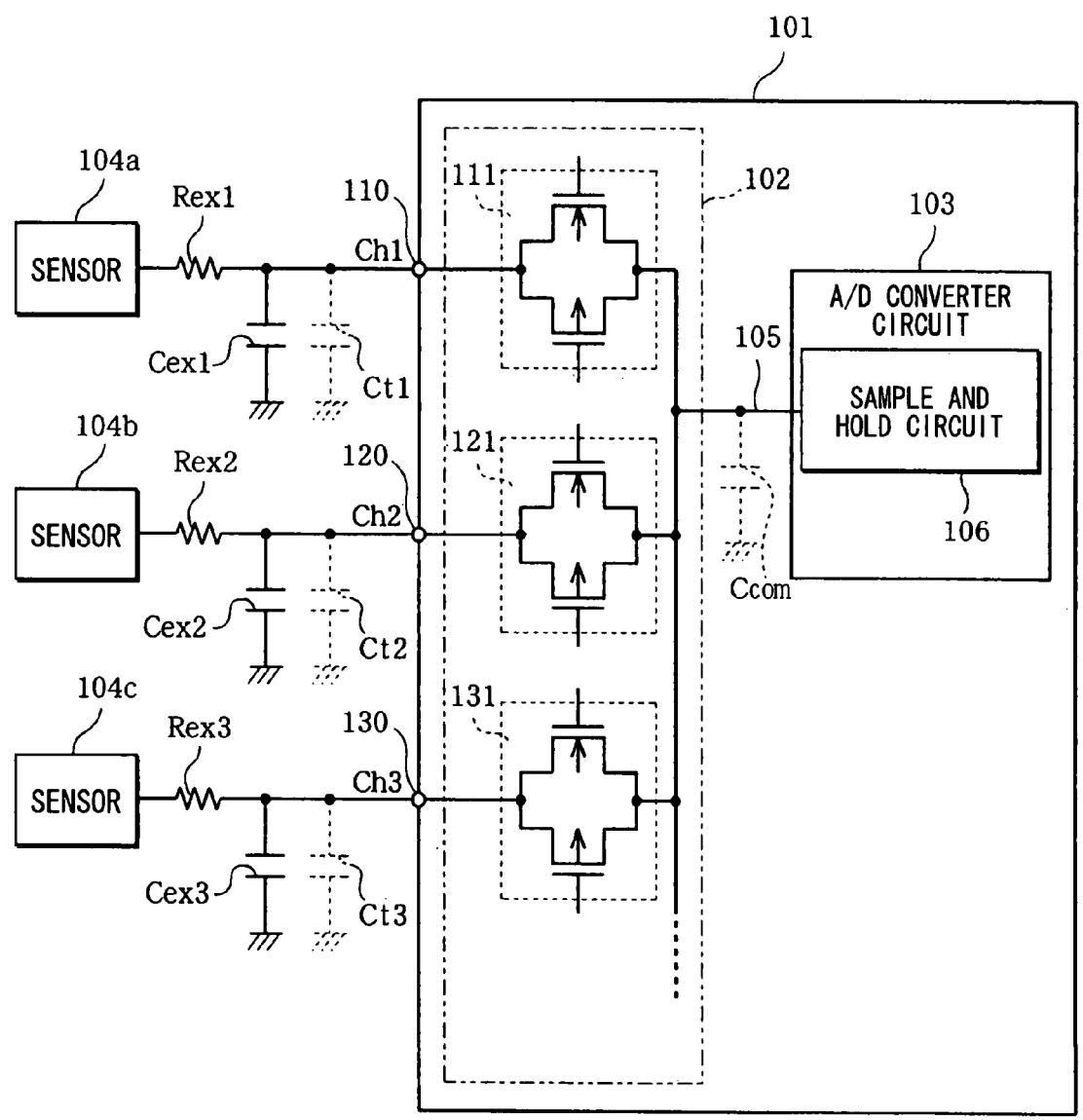
FIG. 17 is a circuit diagram of a prior art A/D converter.

A multi-channel sample and hold circuit 77 according to the tenth embodiment of the invention will be described with reference to FIG. 16.

The sample and hold circuit 77, which is almost the same in structure as the sample and hold circuit 6 shown in FIG. 2, except for a series-connected capacitor CIN and a switch S7. The series-connected capacitor CIN (offset compensation capacitor) is connected between the inverting input terminal of the operational amplifier 3 and the common line 5 to hold an electric charge that corresponds to an offset voltage of the operational amplifier 3, and the switch S7 is connected between the common line 5 and the ground. The sample and hold circuit 77 has a control circuit 78 instead of the control circuit 7.

In the state of sampling, the control circuit 78 turns on the switches S11, S12, S21, S22, S31, S32, S1 and S7 and turns off the switches S13, S15, S23, S25, S33 and S35. Accordingly, the capacitors CS10, CS20 and CS30 are respectively charged with electric charges that respectively correspond to the input signals Vin1, Vin2 and Vin3, and the capacitor CIN is charged with an electric charge that corresponds to the offset voltage of the operational amplifier 3.

When, thereafter, the channel Ch1 is selected to hold the input signal Vin1, the control circuit 78 turns off the switches S12, S1 and, immediately thereafter, turns off the switches S11, S7. Accordingly, the capacitor CIN is charged by the hold voltage of the operational amplifier 3. Thereafter, the switches S13, S15 are turned on, so that the capacitor CS10 is connected via the capacitor CIN between the inverting input terminal of the operational amplifier 3 and the output terminal thereof. After a time to settle has passed, the input signal Vin1 held by the capacitor CS10 is outputted as the output voltage Vout from the output terminal 2 of the operational amplifier 3.

Because the capacitor CIN holds an offset voltage of the operational amplifier 3, the operational amplifier 3 can operate with no offset voltage. Thus, the sample and hold circuit 75 according to the ninth embodiment can hold the input signal with very high accuracy.

Incidentally, the recursive A/D converter circuit used in the multi-channel sample and hold circuits according to the first to fourth embodiments, the eighth to tenth embodiments may be replaced with another type A/D converter such as a pipe line type A/D converter or a successive approximation type A/D converter. The switches for both disconnecting and holding can be separated. The multi-channel A/D converters according to the fifth to seventh embodiments may be a differential type. The sample and hold circuit may be inserted between the output terminal and the input terminal of the multiplying D/A converter except for the first and second switches.

Figure 3:
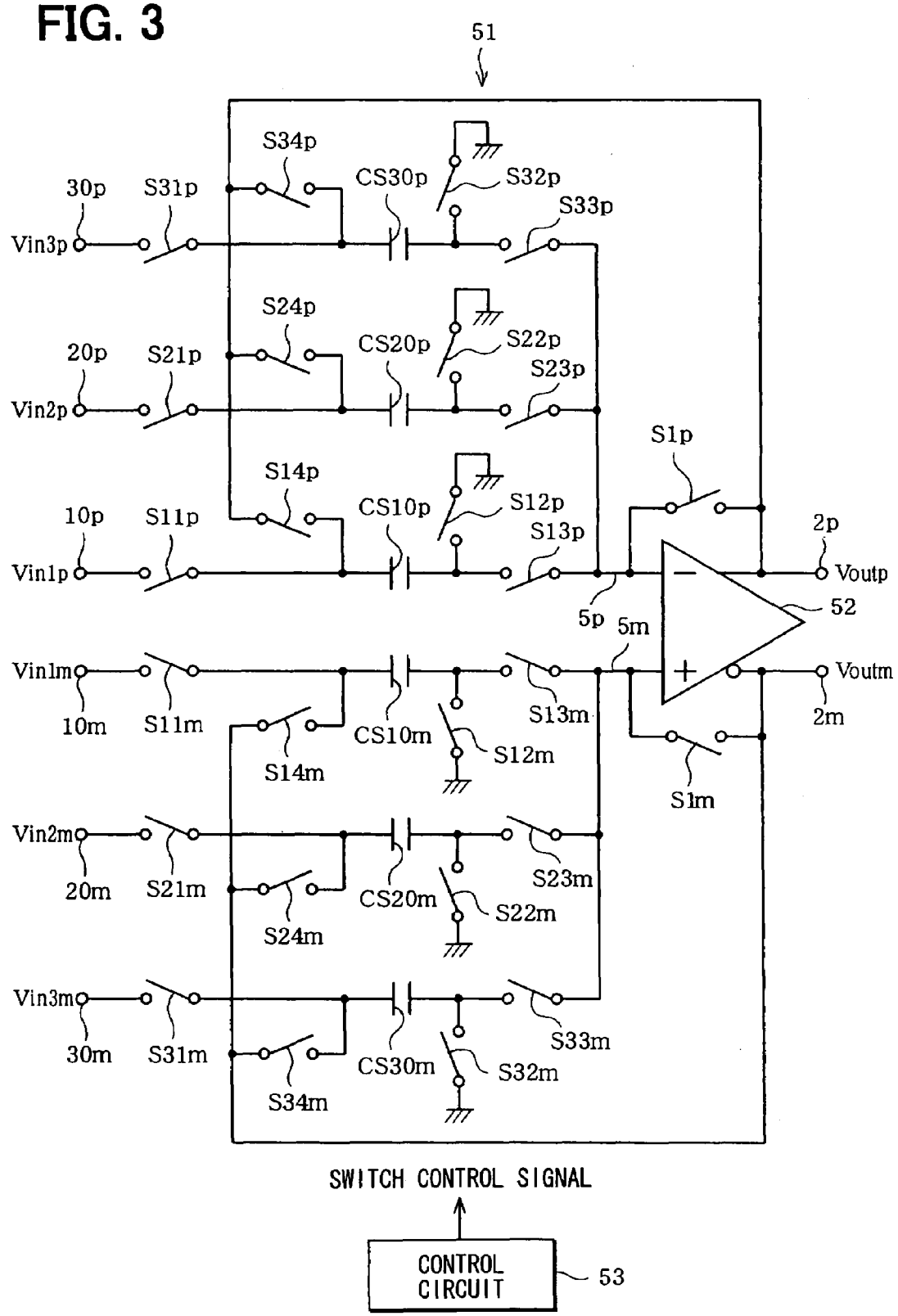
FIG. 3 is a circuit diagram of a multi-channel sample and hold circuit according to the third embodiment of the invention.
Figure 4:
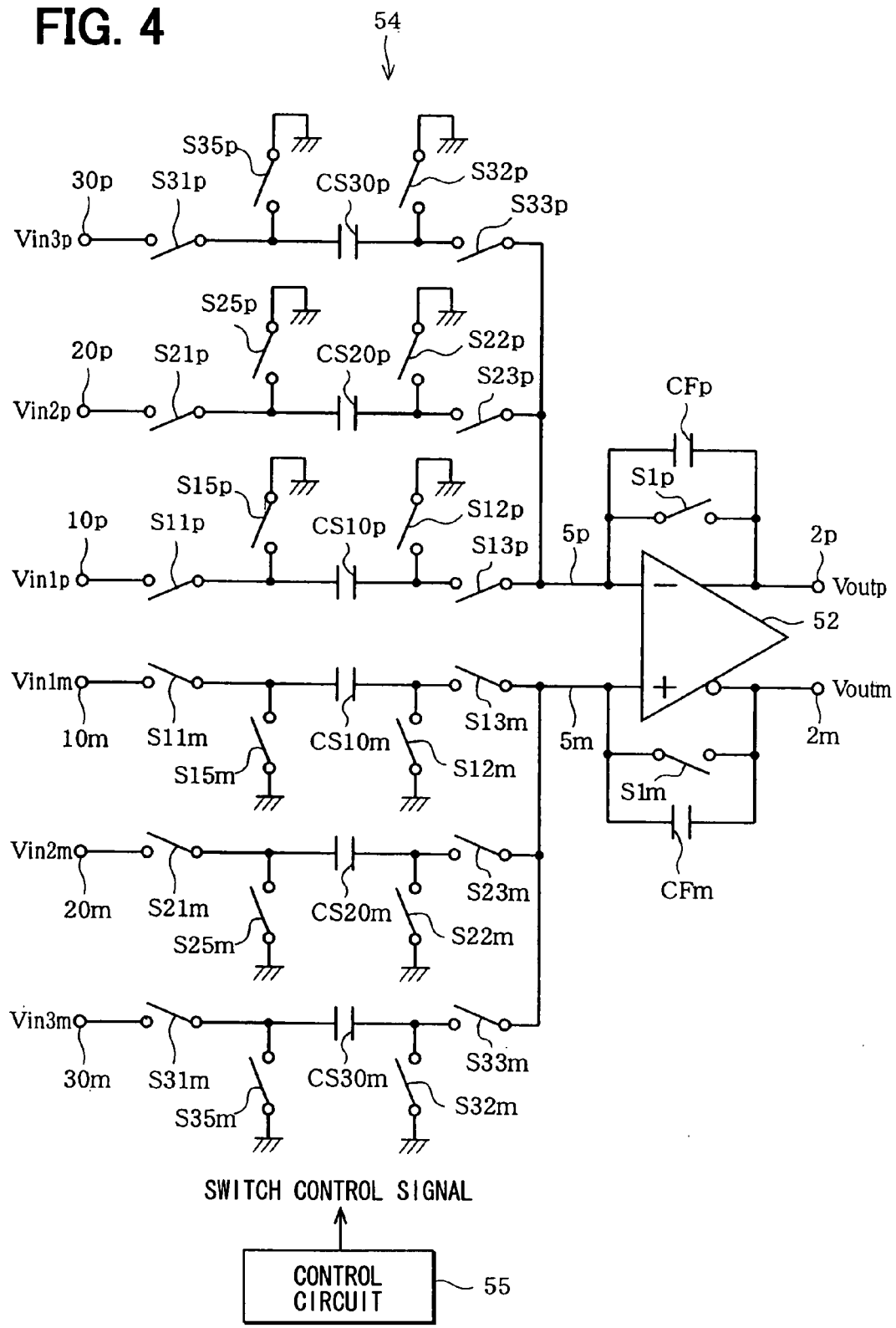
FIG. 4 is a circuit diagram of a multi-channel sample and hold circuit according to the fourth embodiment of the invention.
Figure 5:
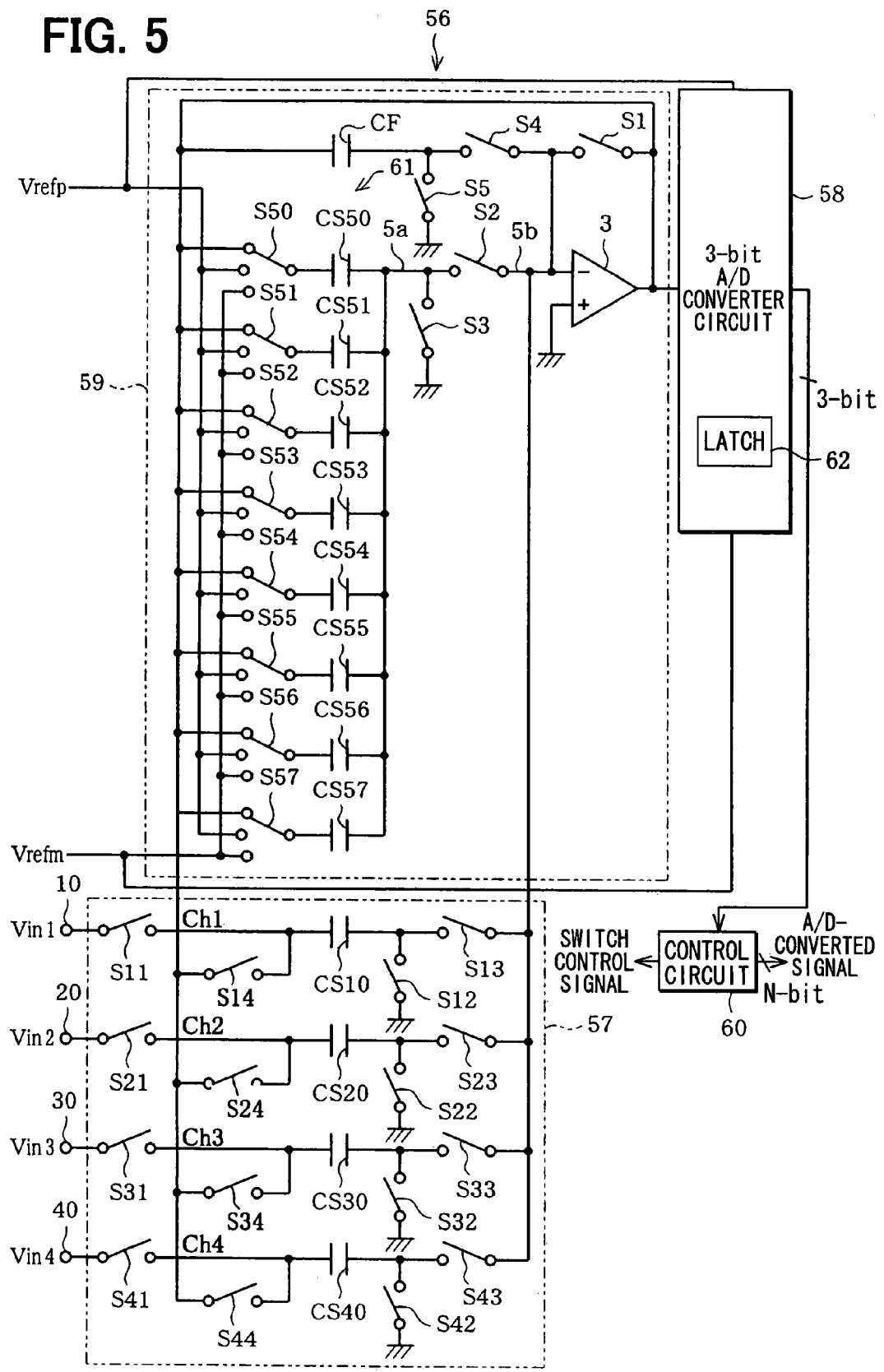
FIG. 5 is a circuit diagram of a multi-channel recursive A/D converter according to the fifth embodiment of the invention.

The offset compensating capacitor CIN can be used in the multi-channel sample and hold circuits 51, 54 shown in FIGS. 3, 4, and the multi-channel recursive A/D converters 56, 64, 71.

In the foregoing description of the present invention, the invention has been disclosed with reference to specific embodiments thereof. It will, however, be evident that various modifications and changes may be made to the specific embodiments of the present invention without departing from the scope of the invention as set forth in the appended claims.

Accordingly, the description of the present invention is to be regarded in an illustrative, rather than a restrictive, sense.

What is claimed is:

1. A multi-channel sample and hold circuit comprising:
   an operational amplifier having a pair of input terminals and a signal output terminal, one of the pair of input terminals being connected to a reference voltage;
   a plurality of electric charge setting channels each of which includes
      a signal input terminal,
      an electric charge setting capacitor,
      a first electric charge setting switch connected between the signal input terminal and one side of the electric charge setting capacitor,
      a second electric charge setting switch connected between the other side of the electric charge setting capacitor and the reference voltage,
      a channel separating switch connected between the other side of the electric charge setting capacitor and the other input terminal of the operational amplifier, and
      a holding switch connected between the one side of the electric charge setting capacitor and the signal output terminal of the operational amplifier; and
   a control circuit for selecting one of the electric charge setting channels to hold a signal that is inputted to the input terminal thereof, wherein:
      the control circuit turns off the first and second electric charge setting switches of the selected channel and turns on the holding switch and the channel separating switch of the selected channel to connect the electric charge setting capacitor of the selected channel between the other of the pair of input terminals and the signal output terminal of the operational amplifier; and
      the control circuit simultaneously turns off the other channel separating switches and the other holding switches of channels that are not selected by the control circuit to separate the other electric charge setting capacitors from the operational amplifier and turns on the other first and second electric charge setting switches to connect the other electric charge setting capacitors with the other input terminals of the channels that are not selected by the control circuit.

2. A multi-channel sample and hold circuit as in claim 1, wherein
   the operational amplifier comprises a differential operational amplifier that has an inverting input terminal connected with a half of the channels, a non-inverting input terminal connected with the other half of the channels, an inverting output terminal and a non-inverting output terminal.

3. A multi-channel sample and hold circuit as in claim 1 further comprising
   an offset compensation capacitor connected between the electric charge setting capacitor and the operational amplifier.

4. A multi channel A/D converter comprising
   the multi-channel sample and hold circuit as in claim 1 and an A/D converter circuit for converting the output signal of the multi-channel sample and hold circuit to a digital signal.

5. A multi-channel sample and hold circuit comprising:
   an operational amplifier having an input terminal and an output terminal;
   a holding capacitor connected between the input terminal of the operational amplifier and the output terminal thereof;

initializing circuit for initializing the holding capacitor;
a plurality of electric charge setting channels each of which includes an input terminal, an electric charge setting capacitor, an electric charge setting switch connected between the input terminal and the electric charge setting capacitor, a channel separating switch connected between the electric charge setting capacitor and the input terminal of the operational amplifier and a holding switch;
a reference voltage line; and
a control circuit for selecting one of the electric charge setting channels to hold a signal that is inputted to the input terminal thereof, wherein:
the control circuit turns off the electric charge setting switch of the selected channel and turns on the channel separating switch and the holding switch of the selected channel to connect the electric charge setting capacitor of the selected channel between one of the reference voltage lines and the input terminal of the operational amplifier; and
the control circuit turns off the other channel separating switches and the other holding switches of channels that are not selected by the control circuit to separate the other electric charge setting capacitors from the operational amplifier and turns on the other electric charge setting switches to connect the other electric charge setting capacitors with the other input terminals of the channels that are not selected by the control circuit.

6. A multi-channel sample and hold circuit as in claim 5, wherein:
the operational amplifier comprises a differential operational amplifier that has an inverting input terminal connected with a half of the channels, a non-inverting input terminal connected with the other half of the channels, a non inverting output terminal and a non-inverting output terminal; and
the holding capacitor and the initializing circuit are respectively connected between the inverting input terminal and the inverting output terminal and between the non-inverting input terminal and the inverting output terminal.

7. A multi-channel sample and hold circuit as in claim 6 further comprising
an offset compensation capacitor connected between the electric charge setting capacitor and the operational amplifier.

8. A multi-channel A/D converter comprising:
an A/D converter circuit;
an operational amplifier having an input terminal and an output terminal;
an integrating capacitor connected between the input terminal and the output terminal;
a plurality of reference voltage sources;
an array circuit of a plurality of array capacitors each of which has a first end connectable with the input terminal of the operational amplifier and a second end connectable with one of the reference voltage sources and the output terminal of the operational amplifier;
a control circuit; and
a multi-channel sample and hold circuit including the operational amplifier, a plurality of electric charge setting channels each of which includes a signal input terminal, an electric charge setting capacitor, an electric charge setting switch connected in a charging passage of the electric charge setting capacitor, a channel separating switch connected between the electric charge setting capacitor and the input terminal of the operational amplifier and a holding switch, and the control circuit, wherein:
the control circuit selects at least one of the electric charge setting channels and operates the electric charge setting switch, the channel separating switch and holing switch of the selected channel as follows: the control switch turns off the electric charge setting switch and turns on the channel separating switch and the holding switch to connect the electric charge setting capacitor between the input and output terminals of the operational amplifier to A/D conversion by the A/D converter circuit; the control circuit selects one of the integrating capacitor and the capacitors of the array circuit and sets an electric charge that corresponds to voltage outputted by the operational amplifier, initializes those of capacitors of channels that are not selected and, thereafter, turns off the separating switch and the holding switch to separates the electric charge setting capacitor from the operational amplifier;
the control circuit connects the second end of each of the capacitors of the array circuit with one of the reference voltage sources to redistribute the electric charge while the integrating capacitor is connected between the input terminal of the operational amplifier and the output terminal thereof and carries out A/D conversion by the A/D converter circuit of the residual voltage outputted from the operational amplifier, electric charge setting by the residual voltage, initializing the capacitors and redistributing the electric charges as many time as necessary; and
the control circuit turns off the channel separating switches and the holding switches of channels that are not selected to separate electric charge setting capacitors of the channels that are not selected from the operational amplifier and turns on the electric charge setting switches of the channels that are not selected.

9. A multi-channel A/D converter as in claim 8, wherein:
the array circuit comprises a first switch connected between the first ends of the capacitors and the input terminal of the operational amplifier and a second switch connected between the first ends of the array capacitors and a reference voltage source;
the control circuit turns off the first switch and turns on the second switches to set an electric charge to the electric charge setting capacitor of the channel that is selected and to initialize the electric charge setting capacitors of the channel that are not selected;
the control circuit, thereafter, turns off the second switch, turns on the first switch and connects the integrating capacitor between the input terminal of the operational amplifier and the output terminal thereof to redistribute the electric charge to the array capacitors; and
the control circuit turns off the first switch and turns on the second switch to set electric charges to the array capacitors.

10. A multi-channel A/D converter comprising:
an A/D converter circuit;
an operational amplifier;
a control circuit;
a multi-channel sample and hold circuit including the operational amplifier, a plurality of electric charge setting channels each of which includes a signal input terminal, a first electric charge setting capacitor, an electric charge setting switch connected between the signal input terminal and the first electric charge setting capacitor, a channel separating switch connected between the first electric charge setting capacitor and the input terminal of the operational amplifier and a holding switch for connecting the first electric charge setting capacitor between the input and output terminals of the operational amplifier, and the control circuit, a plurality of reference voltage sources;

a plurality of second electric charge setting capacitors each of which has a first end connectable with the input terminal of the operational amplifier and a second end connectable with one of the reference voltage sources and the output terminal of the operational amplifier;

a first switch connected between the first ends of the second electric charge setting capacitors and the input terminal of the operational amplifier; and a second switch connected between the first ends of the second electric charge setting capacitors and a reference voltage source; wherein:

the control circuit turns off the electric charge setting switch of a selected channel, turns on the holding switch of the selected channel to connect the first electric charge setting capacitor between the input and output terminals of the operational amplifier, turns off the first and second switches to carry out A/D conversion by the A/D converter circuit, the control circuit, thereafter, turns on the first switch to connect the second end of the second electric charge capacitors with one of the reference voltage sources according to the output signal of the A/D converter circuit to redistribute the electric charge among the second electric charge setting capacitors;

the control circuit carries out A/D conversion of the residual voltage outputted from the operational amplifier, setting electric charge to the second electric charge setting capacitors by the residual voltage and redistributing the electric charge among the integrating capacitor and the second electric charge setting capacitors as many time as necessary to carry out the A/D conversion; and the control circuit turns off the channel separating switches and the holding switches of channels that are not selected to separate electric charge setting capacitors of the channels that are not selected from the operational amplifier, turns off the first switch and turns on the electric charge setting switches of the channels that are not selected and the second switch to connect the second ends of the first electric charge setting capacitors of the channels that are not selected with the signal input terminals of the channels that are not selected.

* * * * *